United States Patent
Kubo et al.

(10) Patent No.: US 7,551,905 B2
(45) Date of Patent: Jun. 23, 2009

(54) DISTORTION COMPENSATION APPARATUS

(75) Inventors: Tokuro Kubo, Kawasaki (JP); Kazuo Nagatani, Kawasaki (JP); Hajime Hamada, Kawasaki (JP); Hiroyoshi Ishikawa, Kawasaki (JP); Nobukazu Fudaba, Kawasaki (JP); Yasuyuki Oishi, Kawasaki (JP); Toru Maniwa, Kawasaki (JP); Hiroyuki Hayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 380 days.

(21) Appl. No.: 10/998,283

(22) Filed: Nov. 23, 2004

(65) Prior Publication Data

US 2005/0101258 A1 May 12, 2005

Related U.S. Application Data

(63) Continuation of application No. PCT/JP02/05371, filed on May 31, 2002.

(51) Int. Cl.
*H01Q 11/12* (2006.01)

(52) U.S. Cl. .................. 455/126; 455/114.3; 455/63.1; 455/67.13; 455/295; 375/296; 375/297; 330/149

(58) Field of Classification Search .................. 455/126, 455/63.1, 114.3, 117, 114.2, 67.11, 67.13, 455/501, 295, 296, 278.1, 283; 330/149; 375/296, 297, 284, 285, 254, 278

See application file for complete search history.

(56) References Cited

U.S. PATENT DOCUMENTS

| 4,276,514 | A | * | 6/1981 | Huang ........................ 330/149 |
| 6,038,259 | A | * | 3/2000 | Nanya ........................ 375/254 |
| 6,275,685 | B1 | * | 8/2001 | Wessel et al. ................ 455/126 |
| 6,677,820 | B2 | * | 1/2004 | Miyatani ..................... 330/149 |
| 2001/0005402 | A1 | * | 6/2001 | Nagatani et al. ............. 375/296 |
| 2001/0048346 | A1 | * | 12/2001 | Matsuura et al. ............ 330/149 |
| 2001/0051504 | A1 | * | 12/2001 | Kubo et al. .................. 455/63 |
| 2002/0041209 | A1 | * | 4/2002 | Miyatani ..................... 330/149 |
| 2002/0097811 | A1 | * | 7/2002 | Kubo et al. .................. 375/296 |

FOREIGN PATENT DOCUMENTS

| EP | 1 191 685 | 3/2002 |
| JP | 2001-189685 | 7/2001 |
| JP | 2001-345718 | 12/2001 |

\* cited by examiner

*Primary Examiner*—Edward Urban
*Assistant Examiner*—Junpeng Chen
(74) *Attorney, Agent, or Firm*—Katten Muchin Rosenman LLP

(57) ABSTRACT

A distortion compensation apparatus of the present invention is used in a transmitter that produces and outputs a second signal from a first signal. This apparatus comprises a delay unit for delaying a feedback signal obtained from by the second signal; and a delay control unit for determining a delay quantity of said delay means so that a timing difference between a reference signal obtained from the first signal and the feedback signal delayed by the delay unit is made small. The delay control unit limits the delay quantity within a predetermined limit value.

10 Claims, 25 Drawing Sheets

PRIOR ART
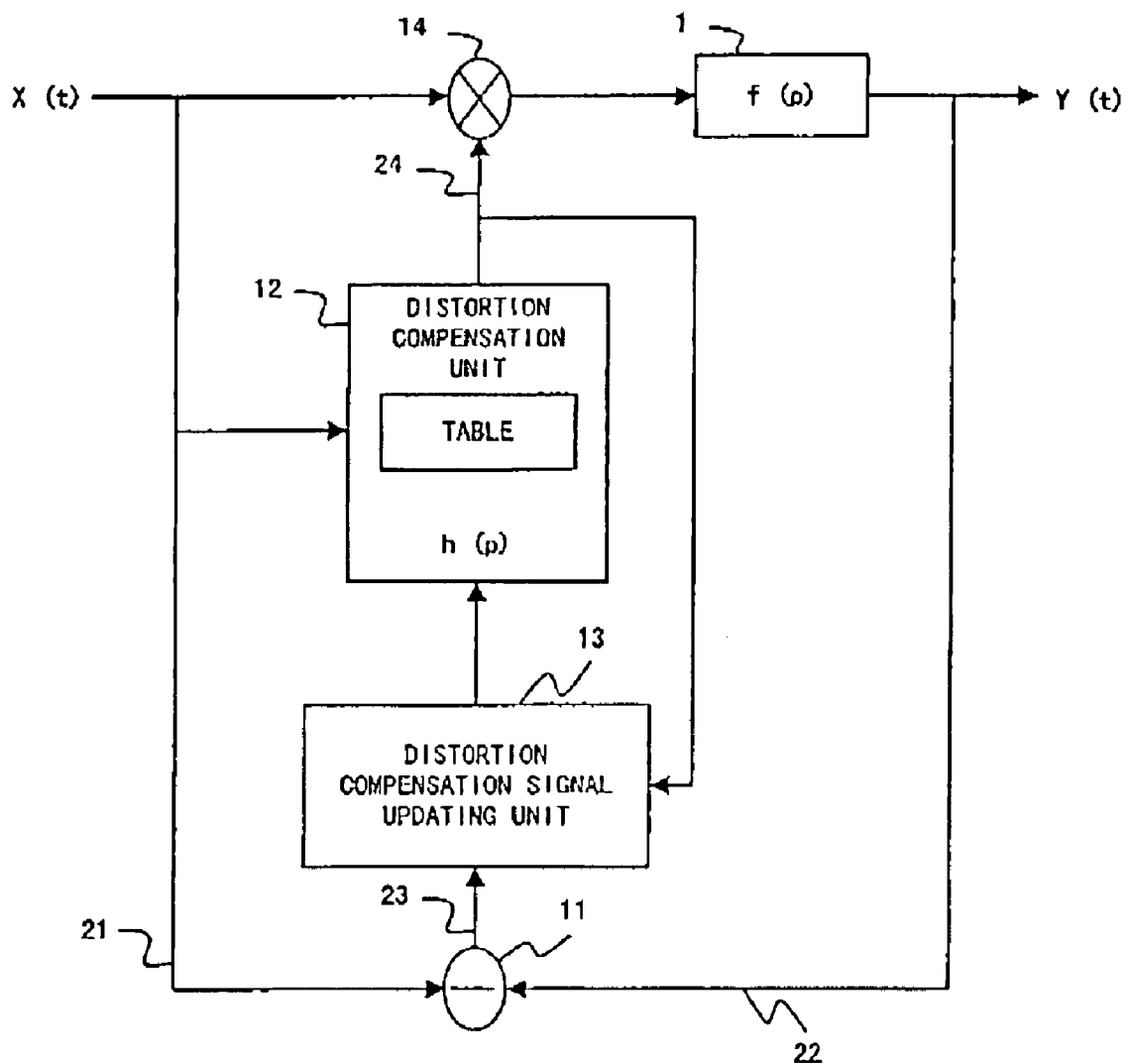
F I G. 1

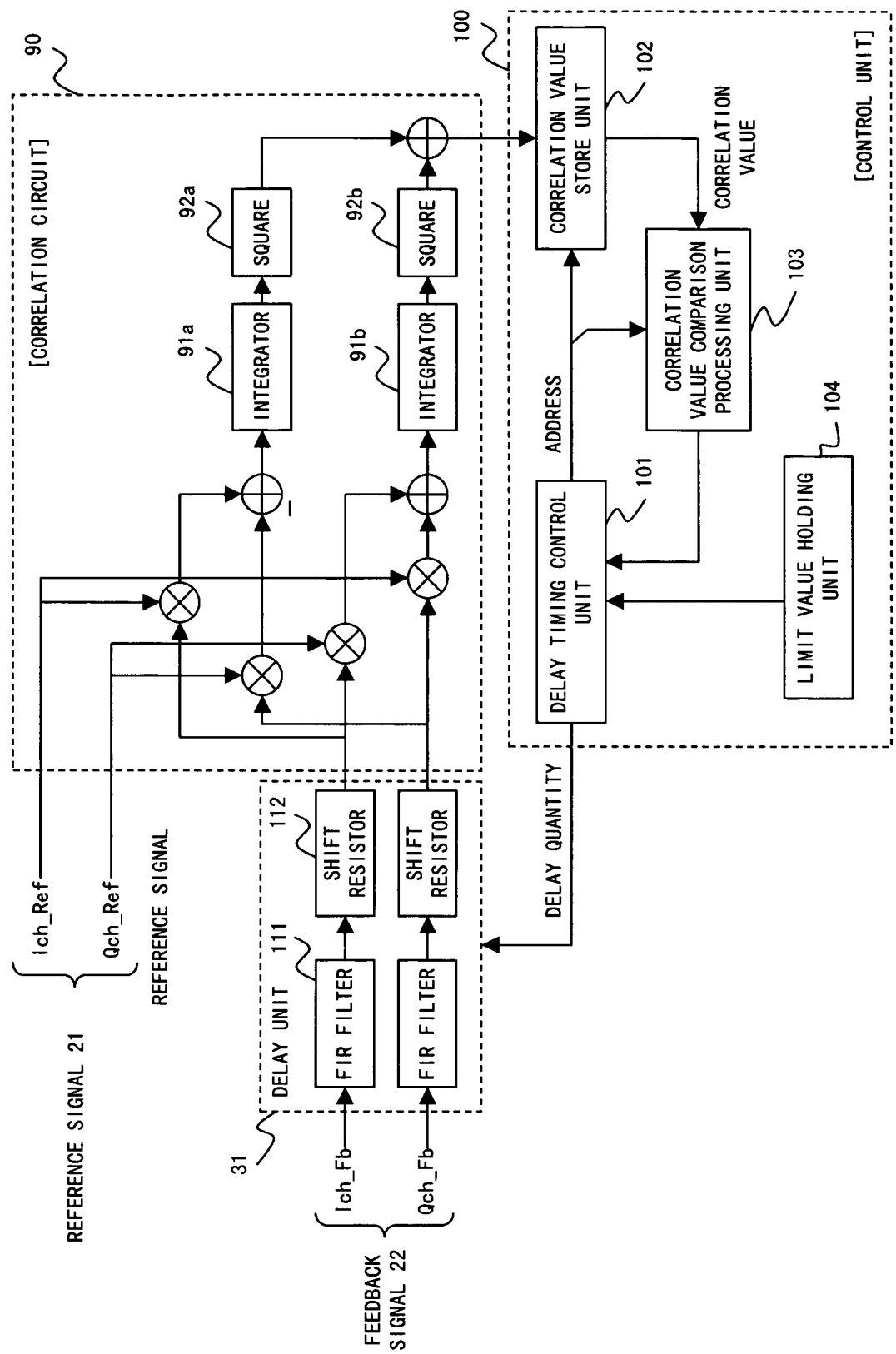
F I G. 6

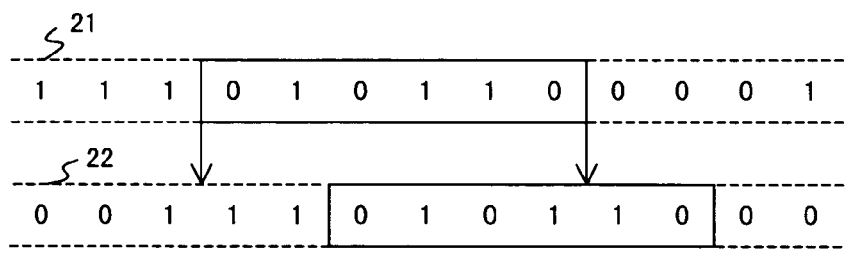
FIG. 7A
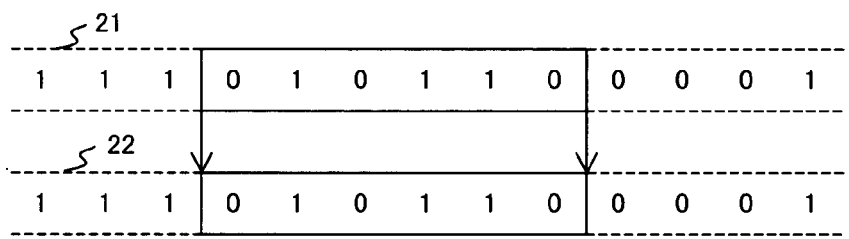
FIG. 7B
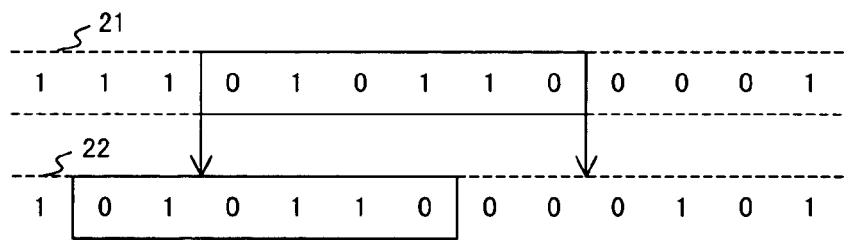
FIG. 7C
FIG. 7

| TEMPERATURE | UPPER LIMIT VALUE | LOWER LIMIT VALUE |
|---|---|---|
| $T_0$ | $L_{u(0)}$ | $L_{d(0)}$ |
| $T_1$ | $L_{u(1)}$ | $L_{d(1)}$ |
| ⋮ | | |
| $T_{13}$ | $L_{u(13)}$ | $L_{d(13)}$ |
| $T_{14}$ | $L_{u(14)}$ | $L_{d(14)}$ |
| $T_{15}$ | $L_{u(15)}$ | $L_{d(15)}$ |
| ⋮ | ⋮ | ⋮ |

F I G. 1 2 A

| SERVICE PERIOD | UPPER LIMIT VALUE | LOWER LIMIT VALUE |
|---|---|---|
| LESS THAN ONE YEAR | $L_{u(0-1)}$ | $L_{d(0-1)}$ |
| ONE TO TWO YEARS | $L_{u(1-2)}$ | $L_{d(1-2)}$ |
| TWO TO THREE YEARS | $L_{u(2-3)}$ | $L_{d(2-3)}$ |
| THREE TO FOUR YEARS | $L_{u(3-4)}$ | $L_{d(3-4)}$ |
| ⋮ | ⋮ | ⋮ |

F I G. 1 2 B

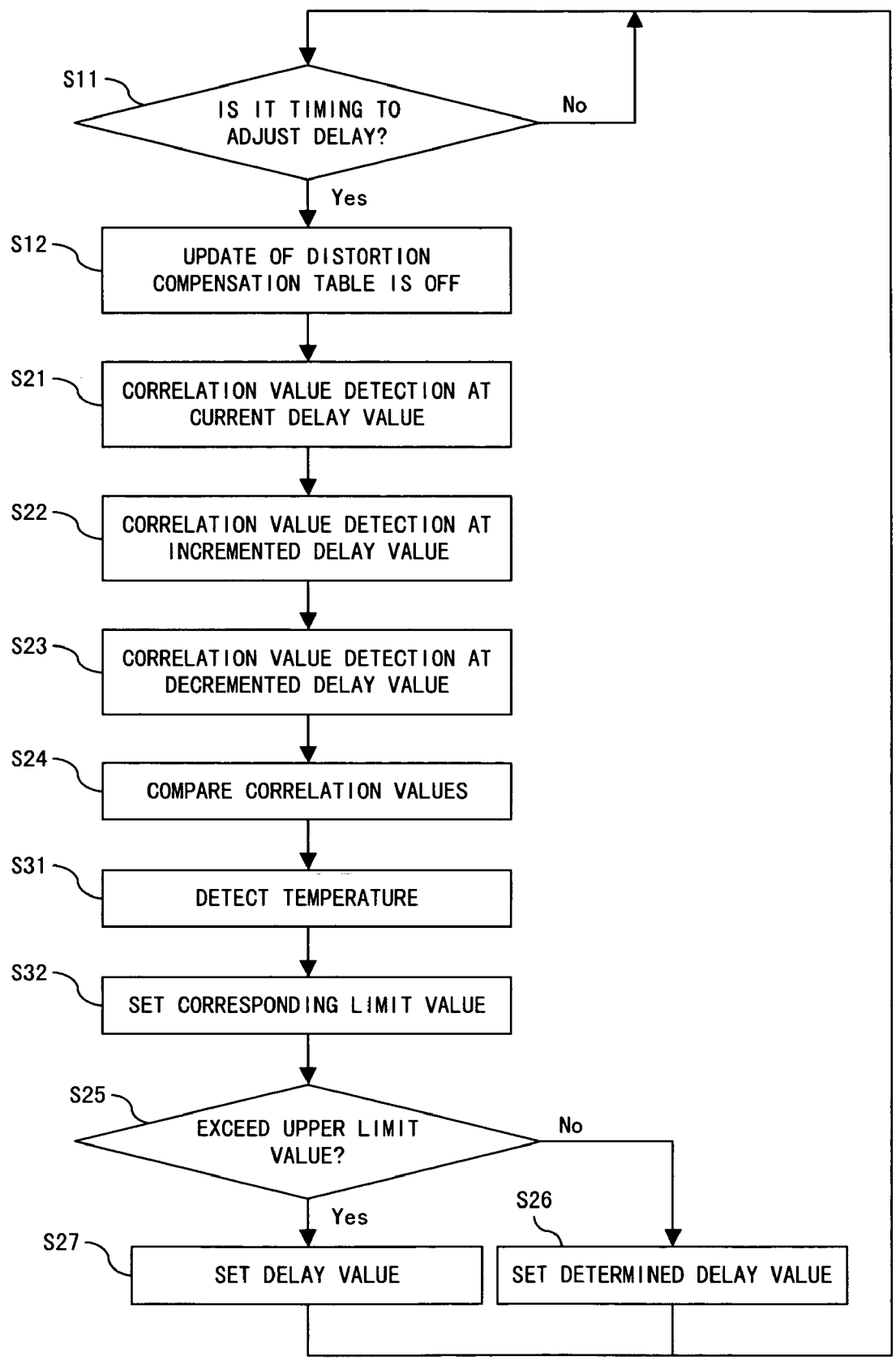
F I G. 1 3

| CARRIER PATTERN | UPPER LIMIT VALUE | LOWER LIMIT VALUE |
|---|---|---|
| 0001 | $L_{u(0001)}$ | $L_{d(0001)}$ |
| 0010 | $L_{u(0010)}$ | $L_{d(0010)}$ |
| 0100 | $L_{u(0100)}$ | $L_{d(0100)}$ |
| 1000 | $L_{u(1000)}$ | $L_{d(1000)}$ |
| 0011 | $L_{u(0011)}$ | $L_{d(0011)}$ |
| 0101 | $L_{u(0101)}$ | $L_{d(0101)}$ |
| ⋮ | ⋮ | ⋮ |
| 1111 | $L_{u(1111)}$ | $L_{d(1111)}$ |

FIG. 18

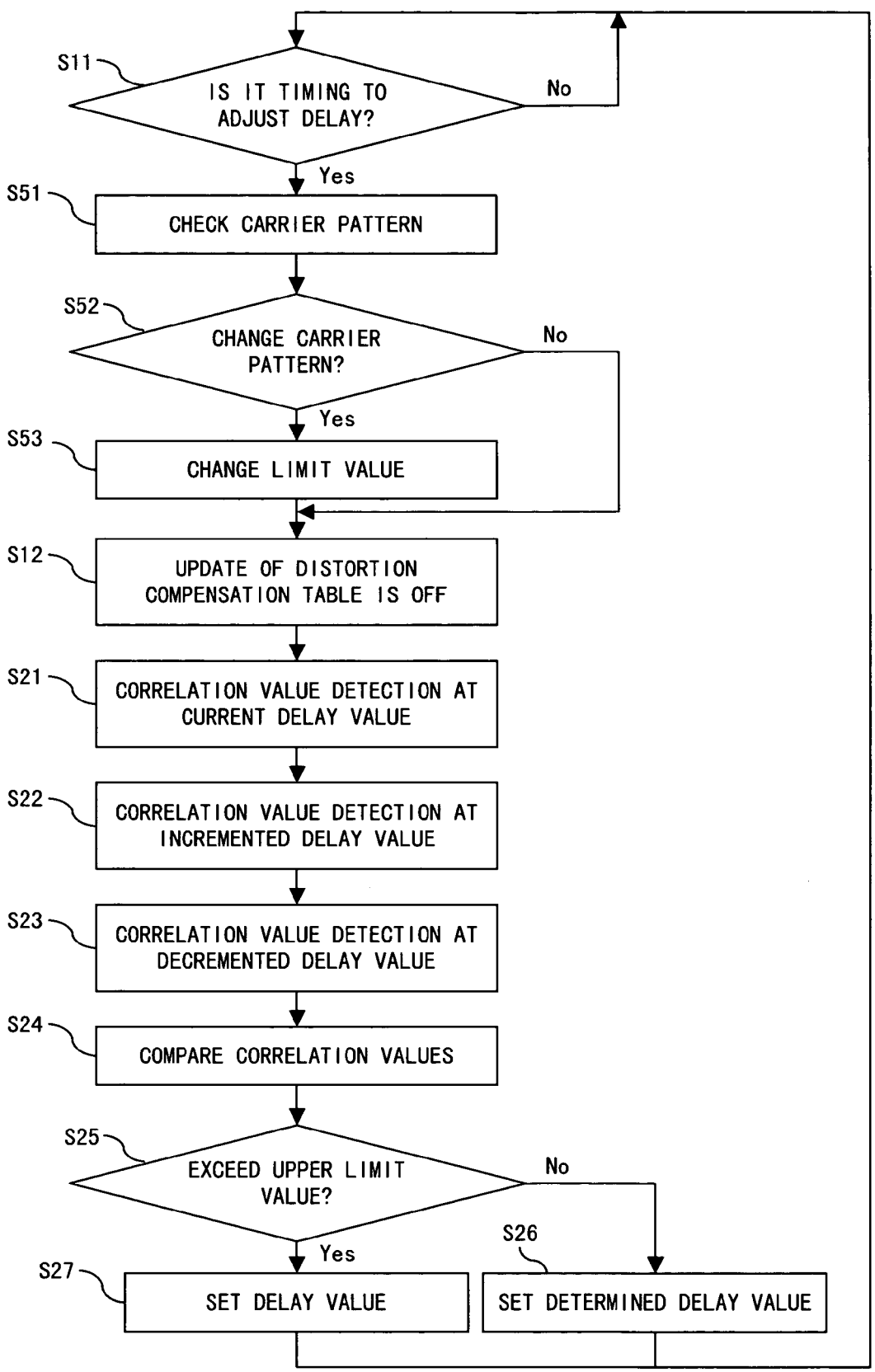
F I G. 19

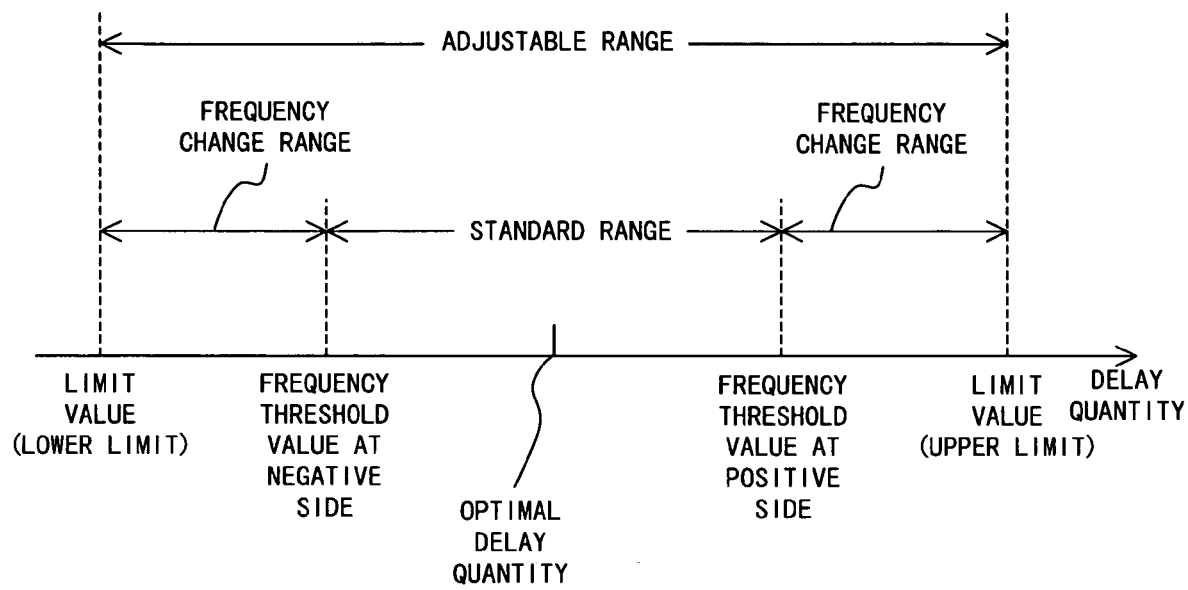
F I G. 2 3

DISTORTION COMPENSATION APPARATUS

CROSS REFERENCE TO RELATED APPLICATION

This application is a continuation of an International Application No. PCT/JP02/05371, which was filed on May 31, 2002.

BACKGROUND OF THE INVENTION

1. Field of the Invention

The present invention relates to a distortion compensation apparatus for use in a transmitter that transmits signals.

2. Description of the Related Art

In recent years, mobile communication is commonly used. Effective utilization of communication resources (especially, radio frequency) has been highly demanded. In response to such demands, a wireless system using a linear modulation system (such as QPSK) that uses frequencies efficiently has been practically used.

The wireless system is often required to be small in size and to be operated with low electric power consumption. The wireless system using the linear modulation method requires a transmit circuit having a high linearity. However, a high output power amplifier (a power amplifier) is generally disposed at a last stage of the transmit circuit in the wireless system. Therefore, it is difficult to meet these requirements at the same time. That is to say, when the signal is amplified at a linear region of the high output power amplifier, the linearity is good, but the efficiency of the amplifier becomes poor. In this case, electric power consumption becomes high, which requires a large power source or makes heat dissipation conditions severe. On the other hand, when the signal is amplified in a non-linear region in the high output power amplifier, the efficiency of the amplifier becomes high, but a good linearity cannot be provided. When the linearity becomes poor, the signal is greatly distorted. The characteristic of signal of an adjacent channel becomes poor due to leak power and the like.

To solve the above-mentioned problems, a distortion compensation apparatus is used. The wireless system including the distortion compensation apparatus amplifies the signal in the non-linear region in the high output power amplifier to decrease the electric power consumption, and the distortion of the signal produced in the amplifier is compensated in the distortion compensation apparatus.

FIG. 1 is an illustration for explaining a basic operation of a distortion compensation apparatus. The distortion compensation apparatus is in a digital pre-distortion type in this explanation. It is assumed that an input signal X (t) is processed at a processing unit 1, and is outputted as a signal Y (t).

The distortion compensation apparatus detects or estimates the distortion produced at the processing unit 1, produces a compensation signal that compensates the distortion, and provides the compensation signal to the signal X (t). Specifically, a subtraction circuit 11 produces an error signal 23 representing a difference between the reference signal 21 and the feedback signal 22. The reference signal 21 is not distorted, and is obtained by simply delaying the signal X (t) for a predetermined time. On the other hand, the feedback signal 22 is distorted at the processing unit 1. Accordingly, the error signal 23 corresponds to the distortion produced at the processing unit 1.

A distortion compensation unit 12 comprises a table for storing information that produces a compensation signal 24. A distortion compensation signal updating unit 13 updates the table in the distortion compensation unit 12 based on the error signal 23. The distortion compensation unit 12 produces the compensation signal 24 based on the information extracted from the table using an amplitude or a power of the signal X (t) and the like as a search key. The compensation signal 24 cancels the error signal 23.

A multiplier 14 multiplies the compensation signal 24 to the input signal X (t). Since the distortion produced at the processing unit 1 is compensated by the compensation signal 24, the signal Y (t) has no distortion (or suppressed distortion).

In the distortion compensation apparatus, in order to compensate the distortion adequately, a correct error signal 23 should be produced. In order to provide the correct error signal 23, the timing between the reference signal 21 and the feedback signal 22 should be matched accurately. Accordingly, as shown in FIG. 2, a digital pre-distortion type distortion compensation apparatus generally comprises a delay unit 31 and a delay quantity control unit 32.

The delay unit 31 delays the feedback signal. The delay quantity in the delay unit 31 follows instructions from the delay quantity control unit 32. The delay quantity control unit 32 calculates the delay quantity so that the timing between the reference signal 21 and the feedback signal 22 delayed in the delay unit 31 is matched, and notifies the result to the delay unit 31. As a method of adjusting the timing between the signals (i.e., a method of determining the delay quantity of the feedback signal), it is known to utilize the correlation between the above-mentioned signals, or ACLR (Adjacent Channel Leakage Ratio).

However, due to the trouble or the like, if the reference signal 21 or the feedback signal 22 does not reach the subtraction circuit 11, or if the reliability of the signals is decreased, the erroneous delay quantity is calculated at the delay quantity control unit 32. Once the erroneous delay quantity is determined at the delay quantity control unit 32, an incorrect error signal 24 is produced based on the erroneous delay quantity. As a result, the distortion cannot be compensated. In some cases, the feedback system may be run away and the distortion may rather be increased. When such a situation occurs, the signal of an adjacent to channel may be adversely affected. Accordingly, it is desirable that the distortion compensation apparatus having the configuration described above have a protection function so that the delay quantity calculated in the delay quantity control unit 32 does not indicate an abnormal value.

SUMMARY OF THE INVENTION

An object of the present invention is to provide a distortion compensation apparatus that can suppress distortion of a signal even if any fault occurs.

According to the present invention, a distortion compensation apparatus used in a transmitter that produces and outputs a second signal from a first signal comprises a delay unit for delaying a feedback signal obtained from the second signal, and a delay control unit for determining a delay quantity of the delay unit so that a timing difference between a reference signal obtained from the first signal and the feedback signal delayed by the delay unit. The delay control unit limits the delay quantity within a predetermined limit value.

In this distortion compensation apparatus, the delay quantity in the delay unit has a value within the limited value, even if the reference signal or the feedback signal indicates an abnormal value. Accordingly, even if the reference signal or the feedback signal indicates an abnormal value, the feedback system for compensating the distortion of the signal does not run away, and the distortion is limited to the predetermined value or less.

In this distortion compensation apparatus, the limit value may be determined based on the temperature adjacent to the circuit for producing the second signal from the first signal, a period during which the transmitter has been used, and a pattern or patterns of the one or more carrier waves used for transmitting the second signal. This configuration allows an optimal limit value to be set depending on the environment under which the transmitter is used. The accuracy of the distortion compensation is expected to be improved.

BRIEF DESCRIPTION OF THE DRAWINGS

FIG. 1 is an illustration for explaining a basic operation of a distortion compensation apparatus;

FIG. 6 shows the delay quantity control unit;

FIGS. 7A to 7C are illustrations for explaining an operation of a correlation circuit;

FIG. 12A is a schematic view showing a table into which a corresponding relationship between a temperature and a limit value of delay quantity is registered;

FIG. 12B is a schematic view showing a table into which a corresponding relationship between a service period (aged deterioration) and a limit value of delay quantity is registered;

FIG. 13 is a flowchart of a processing for determining the delay quantity referring to the temperature;

FIG. 18 is a schematic view showing a table into which a corresponding relationship between a carrier pattern and a limit value of delay quantity is registered;

FIG. 19 is a flowchart of a processing for determining a delay quantity referring to a carrier pattern;

FIG. 23 is an illustration for explaining a frequency change range;

DESCRIPTION OF THE PREFERRED EMBODIMENTS

Embodiments of the present invention will be described below.

Figure 3:
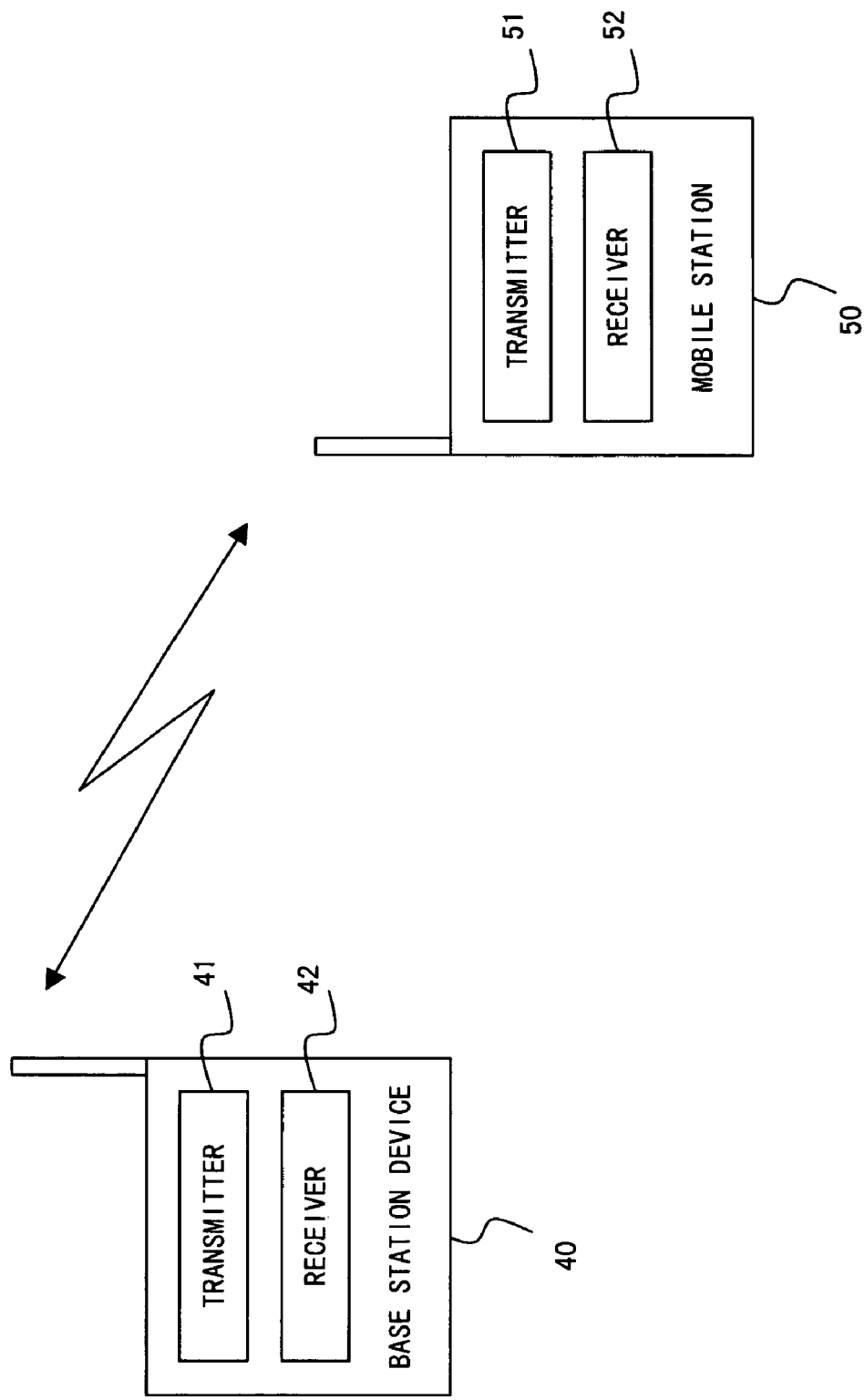
FIG. 3 shows an example of the environment under which the distortion compensation apparatus in one embodiment of the present invention is used.

FIG. 3 shows an example of the environment under which the distortion compensation apparatus in one embodiment of the present invention is used. In FIG. 3, a base station device 40 of a mobile communication system sends and receives a radio signal to/from a mobile station 50. The base station device 40 comprises a transmitter 41 for transmitting the radio signal to the mobile station 50, and a receiver 42 for receiving the radio signal from the mobile station 50. The mobile station 50 is, for example, a mobile phone, and sends and receives the radio signal to/from the base station device 40. The mobile station 50 comprises a transmitter 51 for transmitting the radio signal to the base station device 40, and a receiver 52 for receiving the radio signal form the base station device 40.

In the above-mentioned system, the distortion compensation apparatus of the embodiment is installed in the transmitter 41 or the transmitter 51. The distortion compensation apparatus of the present invention is not necessarily installed in the radio transmitter described above, and may be installed in an alternative transmitter.

Figure 4:
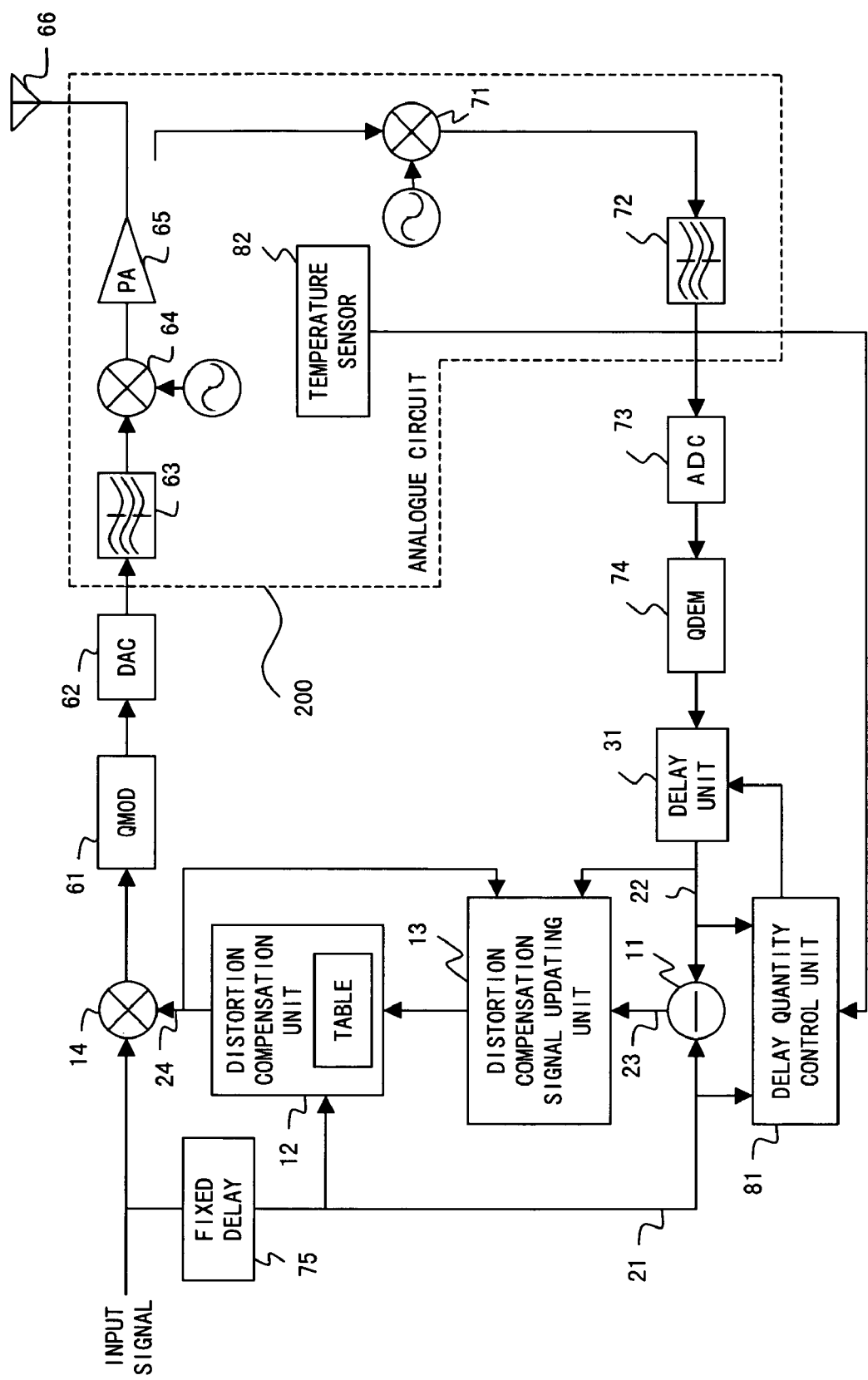
FIG. 4 shows the distortion compensation apparatus in the embodiment.

FIG. 4 shows a distortion compensation apparatus in the embodiment. The distortion compensation apparatus is used in a transmitter for modulating and transmitting an input signal.

The input signal is modulated by a quadrature modulator (QMOD) 61, and then is converted to an analog signal by a D/A converter (DAC) 62. After the analog signal passes through a frequency filter 63, a carrier wave is multiplied to the analog signal at a multiplier 64. The signal is further amplified by a power amplifier (PA) 65, and is transmitted via an antenna 66.

The input signal produces distortion, when it is transmitted as described above. Here, the distortion is produced mainly when the signal is amplified by the power amplifier 65.

The signal amplified by the power amplifier 65 is branched in order to produce a feedback signal 22. By multiplying a periodic signal having a predetermined frequency (for example, the same frequency as the carrier wave described above) to this signal, a multiplier 71 converts the frequency of the signal. Then, the signal passes through a frequency filter 72, and is converted into a digital signal by an A/D converter (ADC) 73. The digital signal is demodulated by a quadrature demodulator (QDEM) 74, and is delayed by the delay unit 31. A demodulation method of the quadrature demodulator 74 corresponds to a modulation method of the quadrature modulator 61.

An output from the delay unit 31 is supplied to the subtraction circuit 11 as the feedback signal 22. The feedback signal 22 is produced from the signal obtained by modulating and amplifying the input signal, as described above. Since the quadrature demodulator 74 corresponds to the quadrature modulator 61, the feedback signal 22 is the same signal as the input signal. However, the feedback signal 22 includes the distortion produced at an analog circuit 200 (mainly, the power amplifier 65). In addition, the feedback signal 22 is delayed from the input signal by the processing time of the feedback system.

The subtraction circuit 11 produces the error signal 23 representing a difference between the reference signal 21 and the feedback signal 22. The reference signal 21 is obtained by delaying the input signal by a predetermined time using a fixed delay circuit 75. The delay time in the fixed delay circuit 75 is set longer than the processing time in the feedback system (the time herein means the time during which the input signal passes through the analog circuit 200 and returns to the subtraction circuit 11 minus the delay time by the delay unit 31).

The distortion compensation unit 12 and the distortion compensation signal updating unit 13 are feasible by the existing arts, as described referring to FIG. 1. That is, the distortion compensation unit 12 comprises the table for storing information that produces the compensation signal 24. The distortion compensation signal updating unit 13 updates the table provided in the distortion compensation unit 12 based on the error signal 23. The distortion compensation unit 12 produces the compensation signal 24 based on the information extracted from the table using the amplitude or the power of the input signal and the like as a search key. The compensation signal 24 cancels the error signal 23.

The multiplier 14 multiplies the compensation signal 24 to the input signal. Since the distortion produced at the analog circuit 200 (mainly, the power amplifier 65) is compensated by the compensation signal 24, the signal transmitted via the antenna 66 has no distortion (or suppressed distortion).

Figure 2:
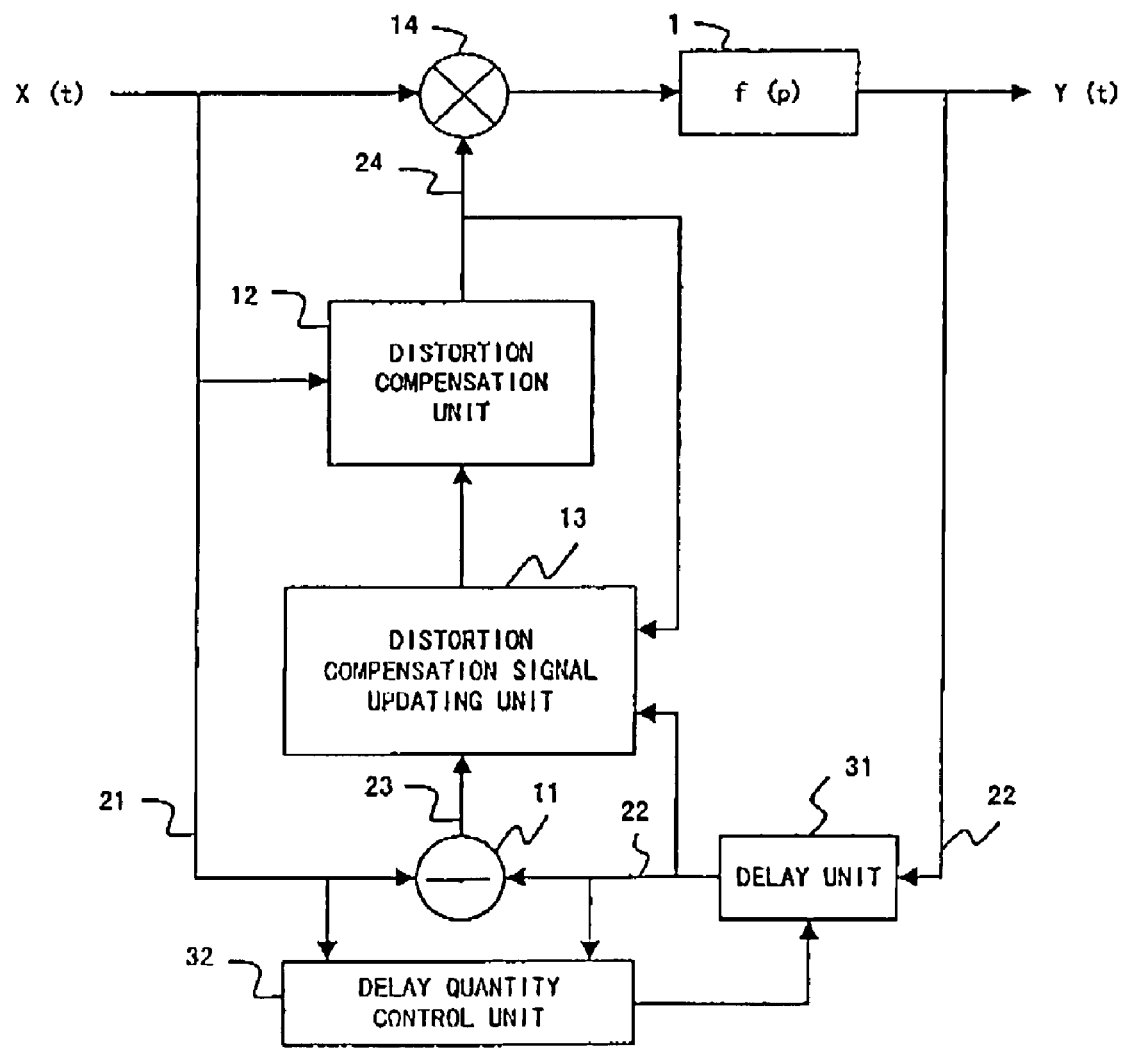
FIG. 2 shows a distortion compensation apparatus comprising a function for adjusting a timing between a reference signal and a feedback signal.

Similar to the delay quantity control unit 32 shown in FIG. 2, a delay quantity control unit 81 calculates the delay quantity so that the timing between the reference signal 21 and the feedback signal 22 delayed in the delay unit 31 is matched (or minimizing the timing difference), and notifies the result to the delay unit 31. The delay quantity control unit 81 comprises a function to protect the transmitter from damage, when the reference signal 21 or the feedback signal 22 indicates an abnormal value caused by any type of damage. The distortion compensation apparatus in the embodiment comprises a temperature sensor 82 adjacent to the power amplifier 65. The delay quantity control unit 81 comprises a function to determine the delay quantity depending on the output of the temperature sensor 82.

Figure 5:
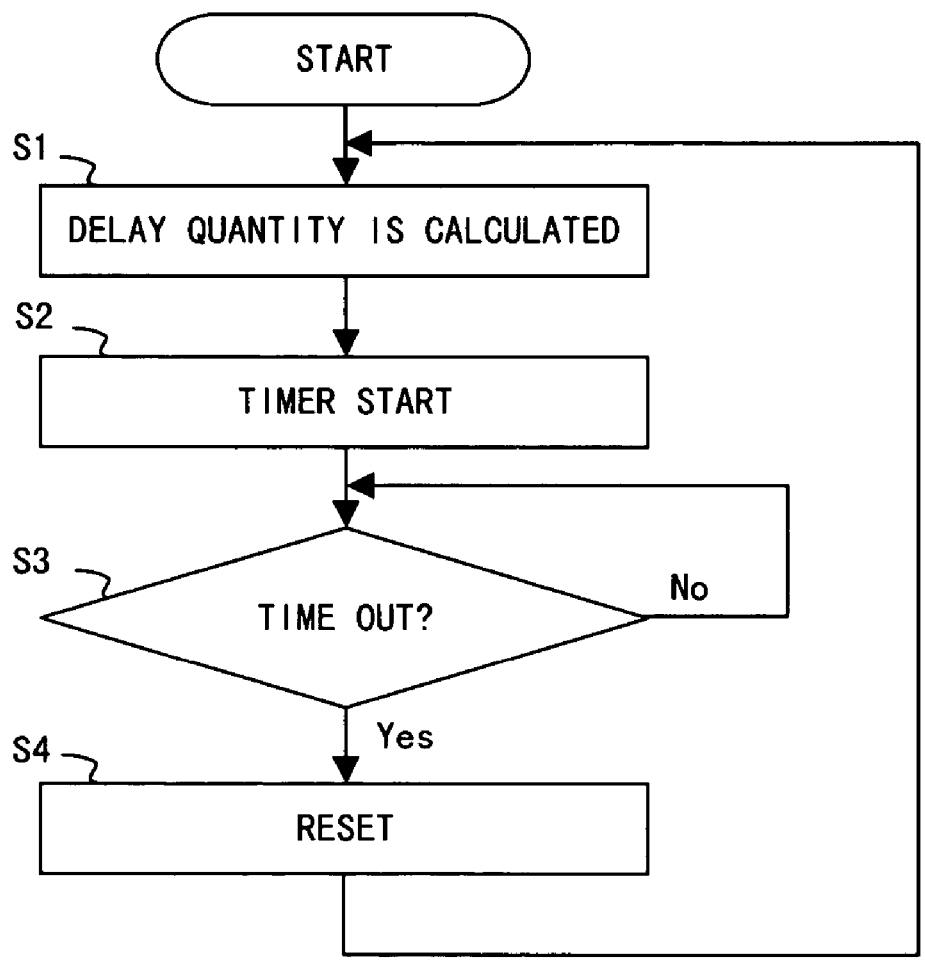
FIG. 5 shows a schematic operation of a delay quantity control unit.

FIG. 5 shows a schematic operation of a delay quantity control unit 81. In step S1, the delay quantity is calculated so that the timing between the reference signal 21 and the feedback signal 22 delayed in the delay unit 31 is matched. The delay quantity is calculated by a method of utilizing the correlation between the above-mentioned signals, or ACLR (Adjacent Channel Leakage Ratio). Based on the calculated delay quantity, the delay unit 31 is instructed.

In steps S2 and S3, a timer is used to measure an elapsed time after the process of the step S1 is carried out. The elapsed time measured by the timer represents a period during which the process of the step S1 is carried out. Once the timer is timed out, after the timer is reset in step S4, it returns to the step S1. This allows the processing for calculating the delay quantity to be periodically carried out.

FIG. 6 shows the delay quantity control unit 81. In this example, the delay quantity is determined using the correlation. The delay quantity control unit 81 comprises a correlation circuit 90 for determining correlation between the reference signal 21 and the feedback signal 22, and a control unit 100. The reference signal 21 and the feedback signal 22 comprise I-component signal and Q-component signal, respectively.

The correlation circuit 90 performs complex multiplication between the I-component signal and the Q-component signal of the reference signal 21, and the I-component signal and the Q-component signal of the feedback signal 22. The signals complex multiplied are supplied to integrators 91*a* and 91*b*. The I-component signal and the Q-component signal of the feedback signal 22 are delayed by the delay unit 31. The delay unit 31 comprises FIR filters 111 and shift resistors 112.

The integrators 91*a* and 91*b* integrate the supplied signals for a predetermined time period, respectively. Squarer units 92*a* and 92*b* square and output the integrated results from the integrators 91*a* and 91*b*. The outputs from the squarer units 92*a* and 92*b* are added by an adder, and are outputted as a "correlation value" between the reference signal 21 and the feedback signal 22.

The correlation circuit 90 is feasible by a known art. Therefore, further details on the configuration and the operation of the correlation circuit 90 is herein omitted, however, referring to FIGS. 7A to 7C, the correlation value will be described in short.

FIG. 7A shows the case that the feedback signal 22 lags from the reference signal 21. In this case, different data sets "010110" and "110101" are multiplied, and the correlation value becomes small. FIG. 7C shows the case that the feedback signal 22 leads over the reference signal 21. In this case, different data sets "010110" and "011000" are multiplied, and the correlation value becomes small. FIG. 7B shows the case that the timing between the feedback signal 22 and the reference signal 21 is matched. In this case, same data sets are multiplied, and the correlation value becomes great.

Figure 8:
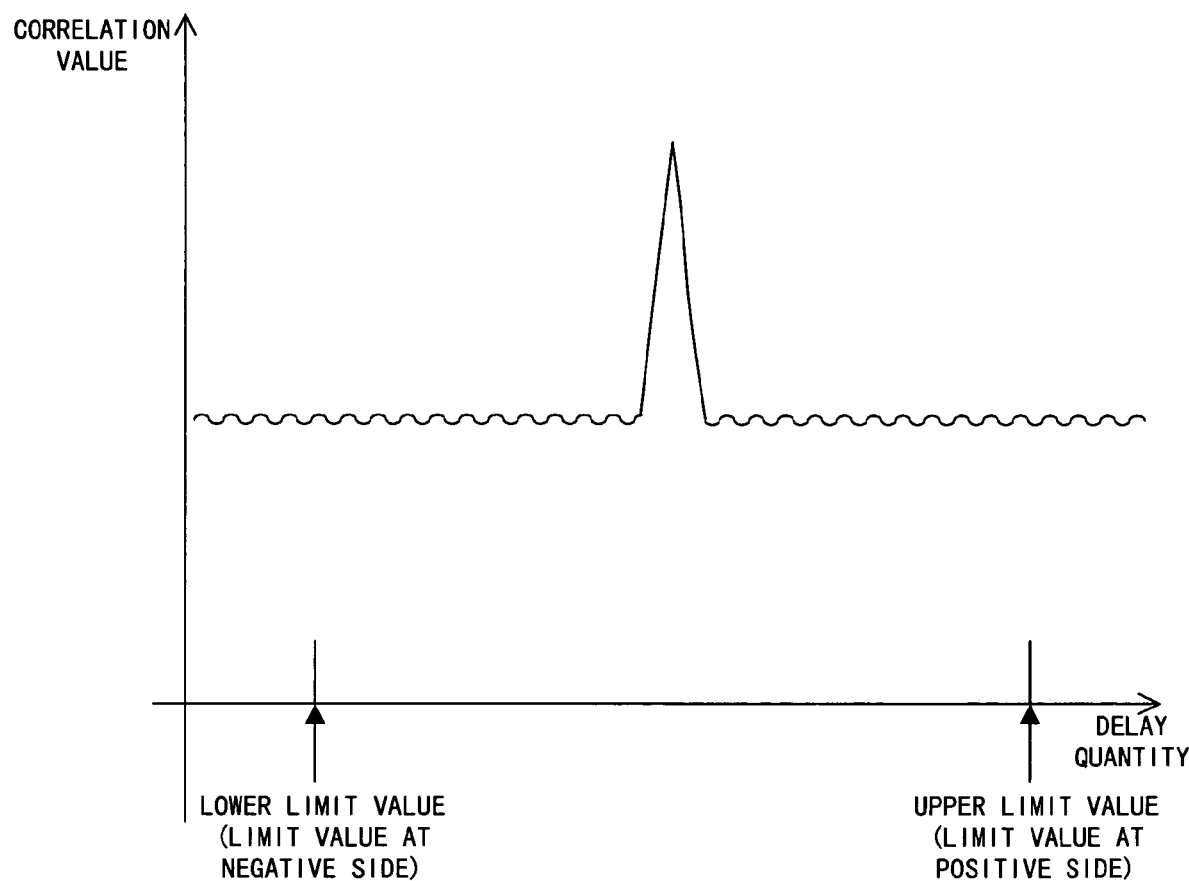
FIG. 8 shows a relationship between a delay quantity and a correlation value.

FIG. 8 shows a relationship between the delay quantity at the delay unit 31 and the correlation value calculated by the correlation circuit 90. As described above, the correlation value between the reference signal 21 and the feedback signal 22 becomes great only when the timing of this pair of signals is matched. The timing difference between the reference signal 21 and the feedback signal 22 are adjusted by the delay quantity at the delay unit 31. Accordingly, if the delay quantity at the delay unit 31 is changed little by little to calculate the correlation value repeatedly, the results shown in FIG. 8 will be obtained. In this case, the timing at which the correlation value becomes a peak is detected as the timing between the reference signal 21 and the feedback signal 22 is matched.

Referring back to FIG. 6, the control unit 100 will be described. The control unit 100 calculates the delay quantity so that the timing between the reference signal 21 and the feedback signal 22 is matched according to the correlation value outputted from the correlation circuit 90.

A delay timing control unit 101 determines the delay quantity in accordance with a predetermined algorithm or an instruction from a correlation value comparison processing unit 103, and notifies it to the delay unit 31. In this case, the delay unit 31 delays the feedback signal in accordance with the given instruction. The "delay quantity" includes data for instructing a shift quantity of the shift resistors 112 and/or data for instructing a TAP factor of the FIR filters 111.

A correlation value store unit 102 holds the correlation value calculated by the correlation circuit 90. The "correlation value" is held in correspondence with the "delay quantity" instructed from the delay timing control unit 101 to the delay unit 31. The correlation value comparison processing unit 103 reads a plurality of "correlation values" held by the correlation value store unit 102, and gives an instruction to the delay timing control unit 101 based on a comparison result.

Figure 9:
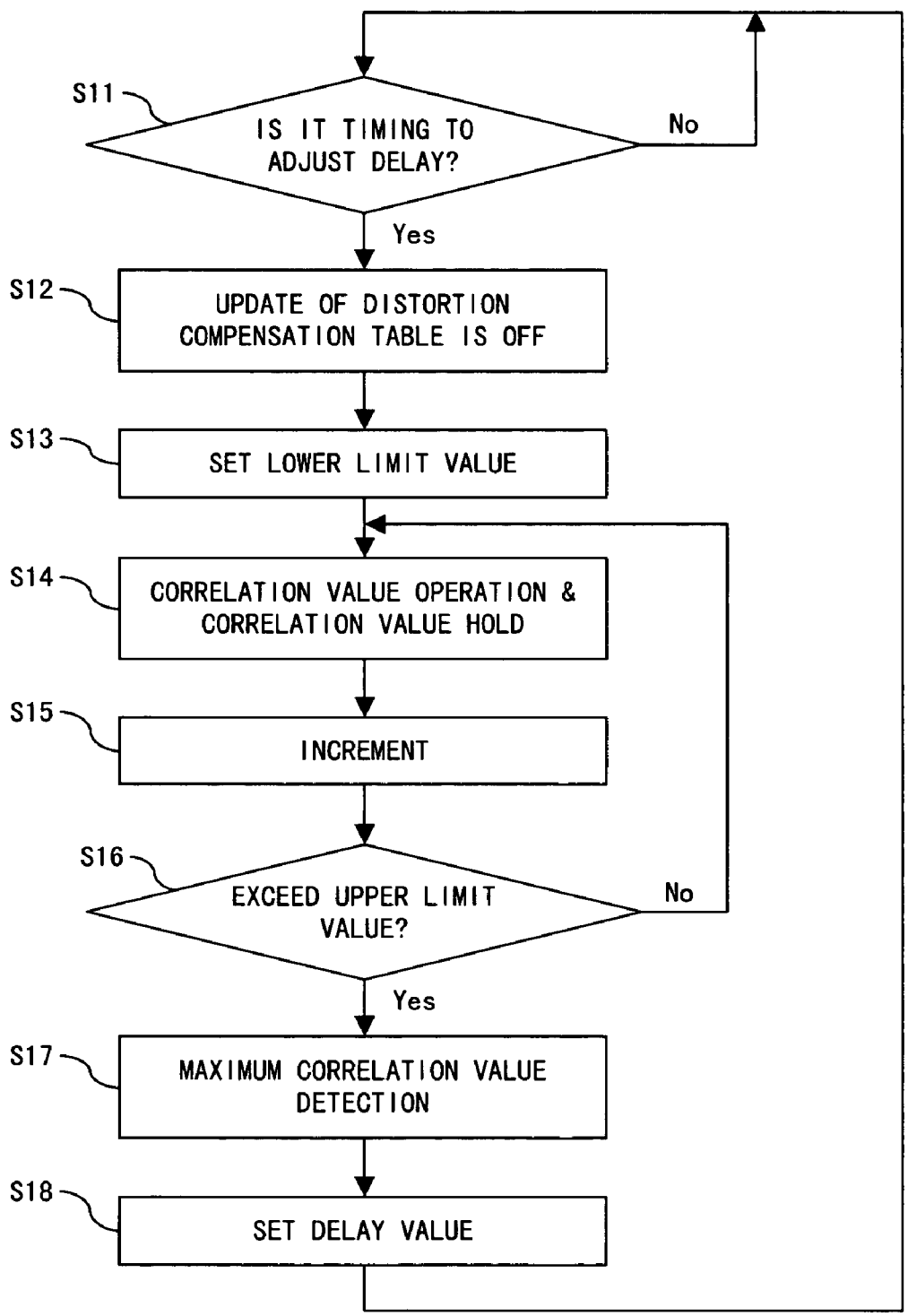
FIGS. 9 and 10 are flowcharts showing a basic operation of the delay quantity control unit.
Figure 10:
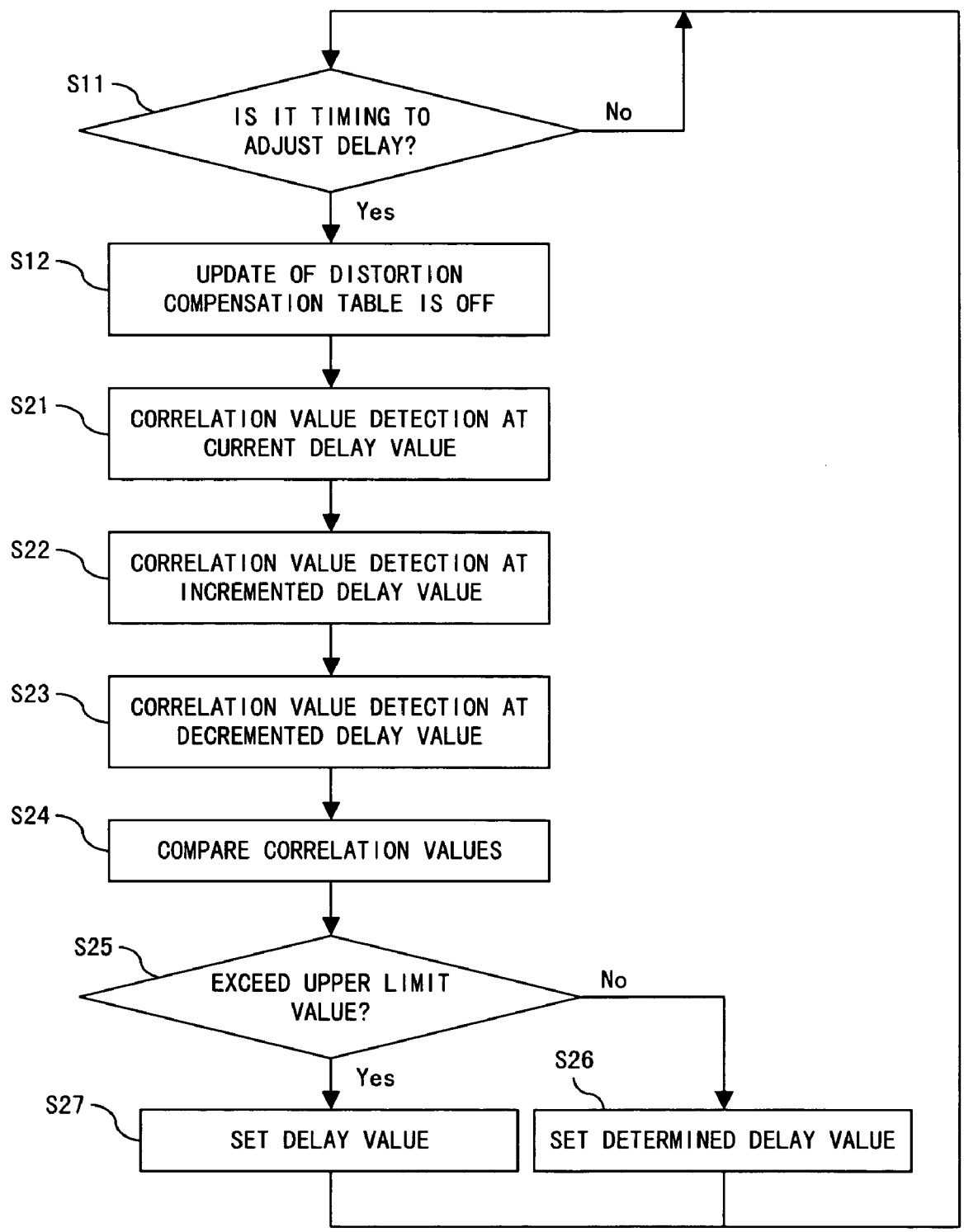

FIGS. 9 and 10 are flowcharts showing a basic operation of the delay quantity control unit 81. FIG. 9 is a flowchart showing a processing for roughly determining the delay quantity. FIG. 10 is a flowchart showing a processing for sufficiently and finely adjusting the delay quantity determined by the processing shown in FIG. 9. The processing shown in FIG. 9 is not necessarily carried out repeatedly, but may be carried out only upon an initial operation.

As explained referring to FIG. 5, the delay quantity control unit 81 carries out the processing for determining the delay quantity at a predetermined interval. In a step S11, when a timer interruption representing the timing for adjusting the delay quantity is allocated, steps S12 to S18 are carried out.

In the step S12, updating the table provided at the distortion compensation unit 12 is stopped. In the step S13, a "lower limit value" is notified to the delay unit 31 as the delay quantity. The delay unit 31 delays the feedback signal by the time corresponding to the lower limit value. The lower limit value is stored in a limit value holding unit 104.

In the step S14, the correlation value between the reference signal 21 and the feedback signal 22 is calculated. The correlation value calculated is held at the correlation value store unit 102.

In the steps S15 and S16, the delay quantity is incremented, and the delay quantity incremented is checked whether or not it reaches an "upper limit value." When the delay quantity does not exceed the upper limit value, the correlation value is again calculated back to the step S14. The "increment" herein means that the delay quantity in the delay unit 31 is allowed to be increased by one clock timing of the shift resistors 112. By carrying out the steps S14 to S16 repeatedly, the correlation values from "the delay quantity=the lower limit value" to "the delay quantity=the upper limit value" are obtained. The upper limit value is also stored in the limit value holding unit 104.

After the correlation values from "the delay quantity=the lower limit value" through "the delay quantity=the upper limit value" are obtained, the maximum correlation value among them is selected in a step S17. In a step S18, the delay quantity at the timing of the maximum correlation value is obtained is detected, and the detected delay quantity is notified to the delay unit 31. Thereafter, updating the table of the distortion compensation unit 12 is restarted.

Thus, according to the processing as shown in the flowchart of FIG. 9, the correlation values "the delay quantity=the lower limit value" through "the delay quantity=the upper limit value" shown in FIG. 8 are obtained, and the delay quantity corresponding to the timing when the maximum correlation value among them is detected is set in the delay unit 31. Consequently, the delay quantity set in the delay unit 31 is always within "the lower limit value" and "the upper limit value."

In the processing shown in the flowchart of FIG. 10, the delay quantity is finely adjusted. The processes in and after steps S21 will be described.

In the step S21, the correlation value is calculated at the current delay quantity (a shift quantity of the shift resistors 112, and the TAP factor of the FIR filters 111). In step S22, the current delay quantity is incremented to calculate the correlation value. In step S23, the current delay quantity is decremented to calculate the correction value. The increment/decrement of the delay quantity are performed by changing the TAP factor of the FIR filters 111. It is possible to more finely adjust the delay quantity by the method of changing the TAP factor of the FIR filters 111 than with the method of changing the shift quantity of the shift resistors 112.

In a step S24, there is detected the delay quantity by which the maximum correlation value among three correlation values obtained in the steps S21 through S23 is obtained. In step S25, the detected delay quantity is checked whether or not it exceeds "the limit value." The limit value herein means the upper limit value or the lower limit value as described above. The phrase "the delay quantity exceeds the limit value" means that "the delay quantity exceeds the upper limit value" or "the delay quantity is lower than the lower limit value."

When the detected delay quantity does not exceed the limit value, the delay quantity is set in the delay unit 31 in step S26. On the other hand, when the delay quantity detected exceeds the limit value, the limit value (the upper limit value or the lower limit value) is set in the delay unit 31 in step S27. Thereafter, updating the table of the distortion compensation unit 12 is restarted.

Thus, according to the processing as shown in the flowchart of FIG. 10, when the delay quantity determined based on the correlation value exceeds the limit value, the limit value is set in the delay unit 31. Consequently, the delay quantity set in the delay unit 31 is always within a range from "the lower limit value" to "the upper limit value."

Figure 11:
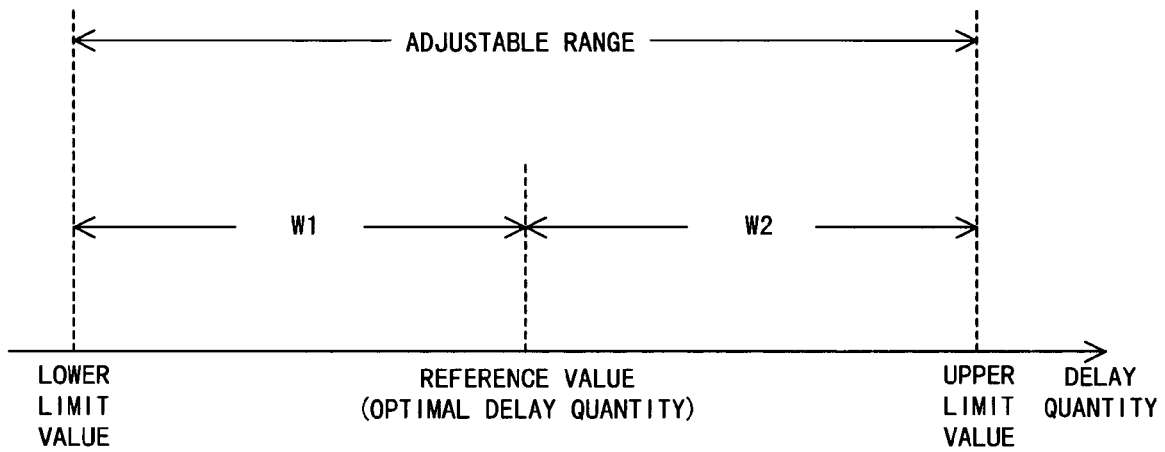
FIG. 11 is an illustration for explaining a limit value.

FIG. 11 is an illustration for explaining the limit value. The limit value includes the upper limit value and the lower limit value, as described above. The upper limit value and the lower limit value may be directly designated, and may be designated by the reference value and the distance from the reference value (W1 and W2), respectively. In the latter case, the distance W1 and the distance W2 may be the same, or may be different.

The limit value is basically determined before the transmitter is shipped (i.e., determined in the production factory). In this case, the limit value may be determined by a simulation and the like, or may be determined actually using the transmitter and transmitting the signal. The limit value may be determined so that a distortion property (for example, ACLR property) satisfies a predetermined standard. When the transmitter can transmit the signal by selecting an arbitrary pattern from a plurality of carrier patterns, the limit value may be determined so that the distortion property satisfies the predetermined standard if the signal is transmitted in the pattern that utilizes the broadest band among the plurality of patterns. The reason is as follows: In the distortion compensation apparatus shown in FIG. 4, when the wide band signal is transmitted, a timing error between the reference signal 21 and the feedback signal tends to induce great signal distortion, as compared with the case that the narrow band signal is transmitted. In other words, when the wide band signal is transmitted, adjusting accuracy of the delay quantity should be high as compared with the case that the narrow band signal is transmitted. Accordingly, as long as the limit value of the delay quantity is determined by supposing that the wide band signal is transmitted, the delay quantity of the feedback signal has high reliability even if the limit value is applied upon transmittance of the narrow band signal.

The limit value of the delay quantity in the delay unit 31 (the delay quantity to delay the feedback signal 22) may be set as a fixed value, but may be dynamically adjusted depending on an external environment or a communication environment. The method of changing the limit value based on the temperature in the transmitter, the service period (aged deterioration) of the transmitter, and the carrier pattern when the transmitter transmits the signal is described below.

In FIG. 4, the delay time of the signal in the analog circuit 200 (including the power amplifier 65) depends on the temperature. Accordingly, the time duration from the input signal is inputted to the feedback signal 22 corresponding to the input signal is supplied to the subtraction circuit 11 depends on the temperature. Thus, it is desirable that the limit value of the delay quantity in the delay unit 31 is adjusted based on the temperature around the analog circuit 200. The temperature around the analog circuit 200 is detected by the temperature sensor 82, and is notified to the delay quantity control unit 81.

FIG. 12A is a schematic view showing a table into which a corresponding relationship between a temperature and a delay quantity is registered. This table corresponds to the limit value holding unit 104 provided in the delay quantity control unit 81. It is assumed that the temperature-dependence of the delay time of the signal at the analog circuit 200 is known. The limit value at each temperature is generated in advance in accordance with the temperature property. However, if the temperature dependency of the delay time of the signal at the analog circuit 200 can be represented by a mathematical expression, the temperature around the analog circuit 200 is detected, from which the limit value may be calculated. In this case, it is not needed to create the table in advance.

FIG. 13 is a flowchart of a processing for determining the delay quantity referring to the temperature. The basic operation for referencing the temperature is the same as the procedure shown in FIG. 10. In order to reference the temperature, the delay quantity where the greatest correlation value is obtained is detected in the step S24, and then the temperature around the analog circuit 200 is detected in step S31. The temperature is detected using the temperature sensor 82. In step S32, the limit values (including the upper and the lower limit values) corresponding to the detected temperature is set. The limit values corresponding to the detected temperature may be extracted from the table shown in FIG. 12A, or may be calculated using the mathematical expression defined in advance. Thereafter, it is determined whether or not the delay quantity detected in the step S24 exceeds the limit value. The processing for notifying the delay quantity determined based on the determination result to the delay unit 31 is the same as explained referring to FIG. 10.

Thus, this method allows the optimum limit value to be set dynamically depending on the environment under which the transmitter is used.

Figure 14:
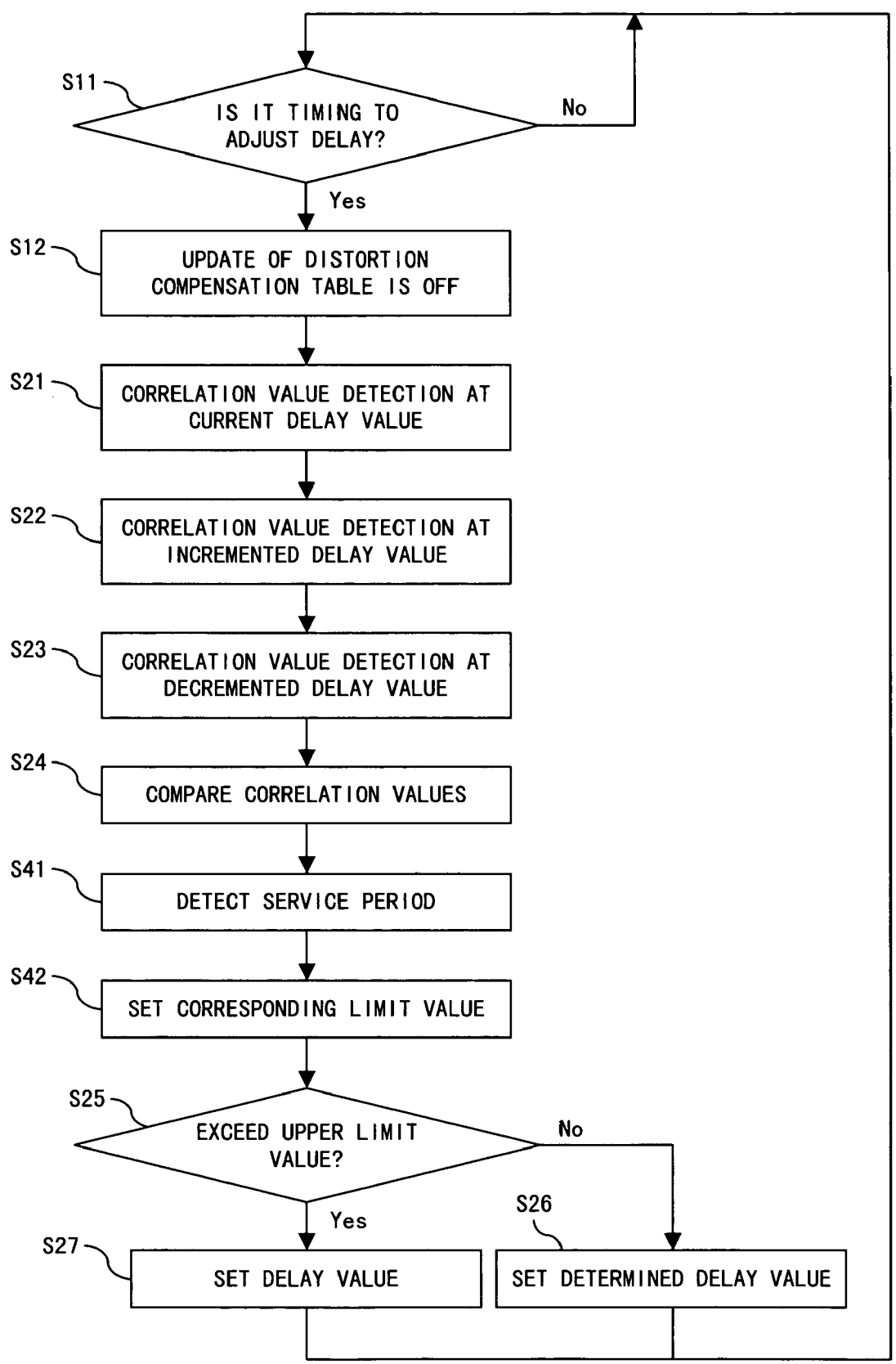
FIG. 14 is a flowchart of a processing for determining the delay quantity referring to the service period of the transmitter.

FIG. 14 is a flowchart of a processing for determining the delay quantity referring to the service period of the transmitter. Basically, the operation is the same as the procedure explained referring to FIG. 13 except that steps S41 and S42 are performed instead of the steps S31 and S32. In the step S41, the service period of the transmitter is detected. The service period of the transmitter is, for example, measured by a timer and the like that is activated when the transmitter is started to be used. In the step S42, the limit value corresponding to the service period detected is set. The limit value corresponding to the service period of the transmitter may be extracted from the table shown in FIG. 12B, or may be calculated using a mathematical expression defined in advance. Herein, aged deterioration properties of respective units in the transmitter (especially, at the analog circuit 200) are known.

The setting of the limit value when the transmitter transmits one or more signals at an arbitrary carrier pattern will be described.

Figure 15:
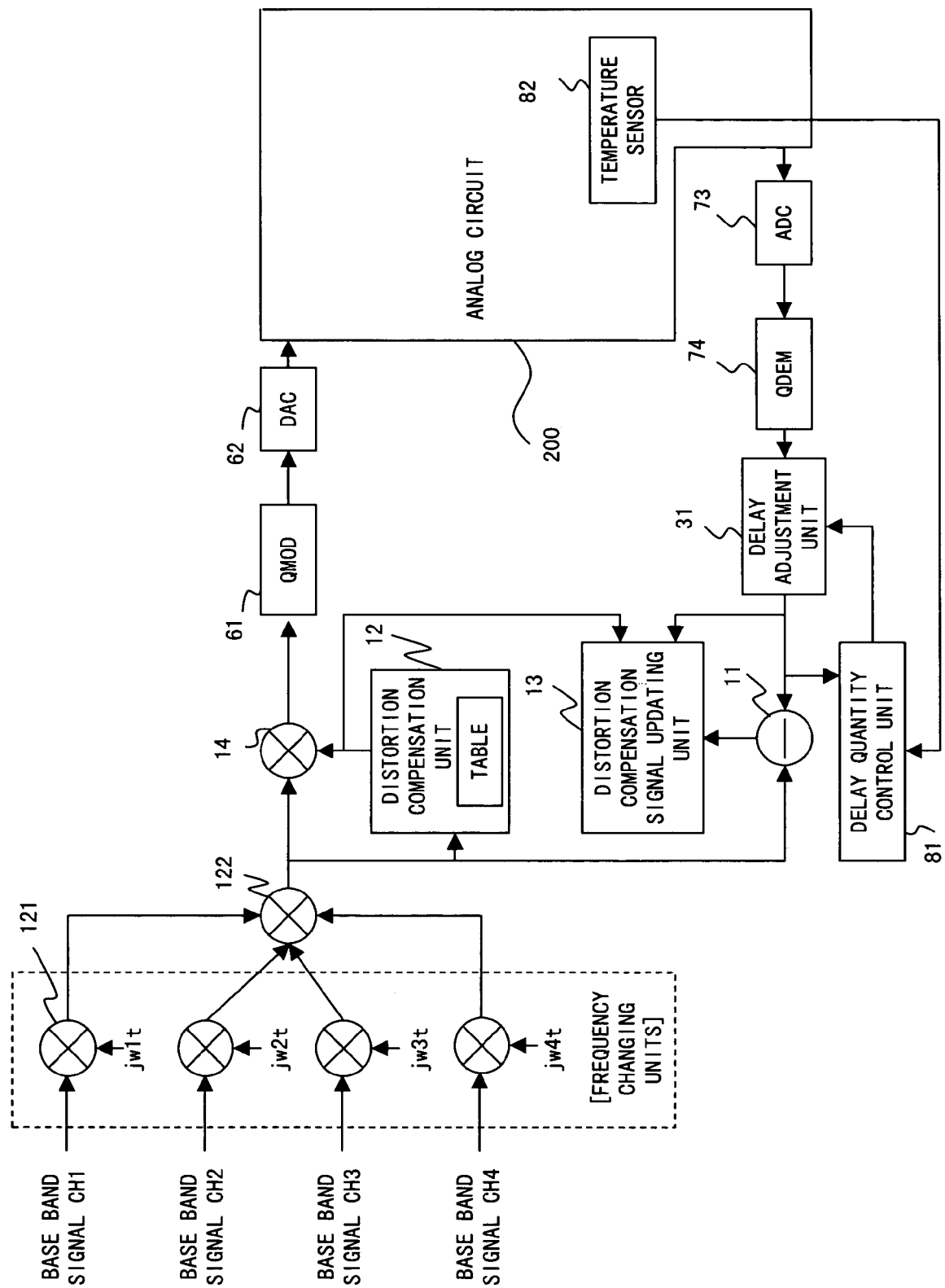
FIG. 15 shows a structure of a multiple carrier transmitter comprising a distortion compensation apparatus.

FIG. 15 shows a multiple carrier transmitter comprising one embodiment of a distortion compensation apparatus. The transmitter can multiplex and transmit four signals. In other words, when base band signals are inputted via channels CH1 to CH4, frequency converting units 121 multiply periodic waves having frequencies ($\omega 1$ to $\omega 4$) corresponding to respective base band signals. The respective base band signals are allocated at different frequency bands. These signals are synthesized by a synthesizer 122, and guided to the quadrature modulator (QMOD) 61.

Thus, the transmitter shown in FIG. 15 can allocate plural input signals at different frequency bands and multiplex them. The basic configuration and the basic operation of the distortion compensation apparatus, the modulation circuit and the analog circuit are the same as explained referring to FIG. 4.

In the above configuration, when the channels to be multiplexed are different, the frequency bands to be used are also changed. For example, in the case where two channels are multiplexed, different frequency bands are used in the case where CH1 and CH2 are multiplexed and in the case where CH3 and CH4 are multiplexed. A combination of the frequency band used is hereinafter referred to as the carrier pattern.

In the above-mentioned multiple carrier transmitter, the optimal value of the delay quantity to be set in the delay unit 31 becomes uniform irrespective of the carrier pattern as long as the signal delay property in the analog circuit 200 does not depend on the frequency. However, when the manufacturing costs or the circuit dimensions are taken into consideration, relatively inexpensive and small units are used for the analog circuit 200. In this case, the signal delay may be frequency-dependent in the analog circuit. Consequently, the optimal value of the delay quantity to be set in the delay unit 31 will be changed in accordance with the carrier pattern.

Figure 16:
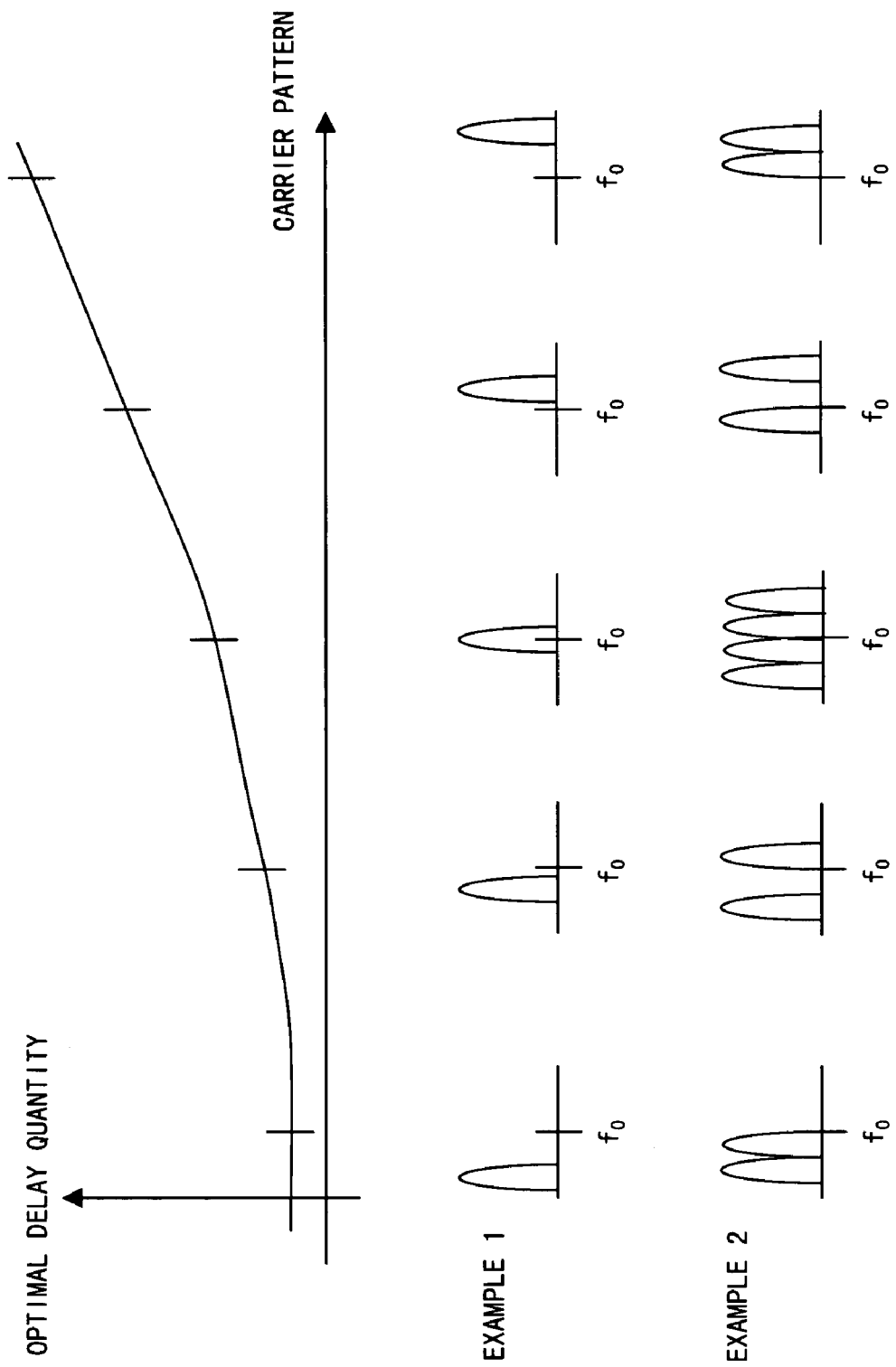
FIG. 16 shows a relationship between a carrier pattern and an optimal delay quantity.

FIG. 16 shows a relationship between a carrier pattern and an optimal delay quantity. In FIG. 16, as example 1, only one signal is transmitted, and as example 2, two channels or four channels are multiplied. In either case shown in FIG. 16, when higher frequency bands are used, the optimal delay quantity is increased.

Figure 17:
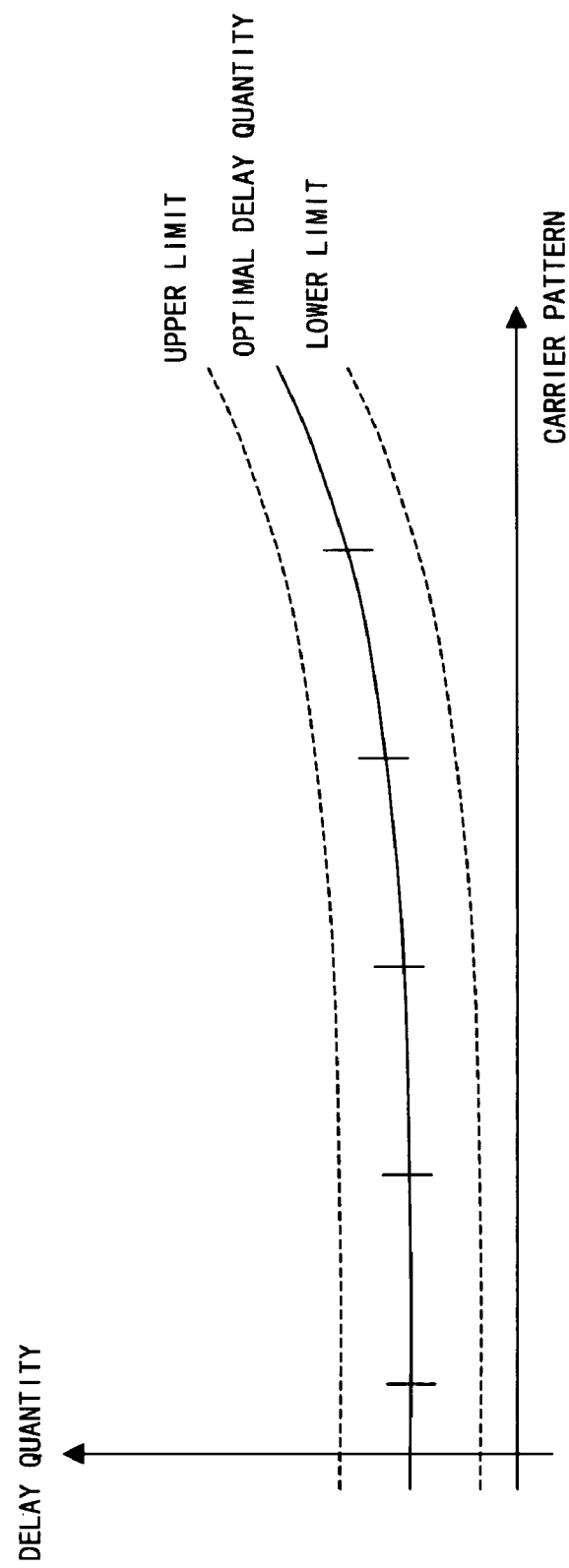
FIG. 17 shows a relationship between a carrier pattern and a limit value.

As described above, when the optimal value of the delay quantity to be set in the delay unit 31 is to be changed in accordance with the carrier pattern, it is desirable that the limit values (including the upper and lower limit values) for limiting a variable range of the delay quantity be changed in accordance therewith as shown in FIG. 17. The distortion compensation apparatus in this embodiment comprises a function of changing the limit value of the delay quantity in accordance with the carrier pattern.

FIG. 18 is a schematic view showing a table into which a corresponding relationship between a carrier pattern and a limit value of a delay quantity is registered. The table corresponds, for example, to the limit value holding unit 104 provided in the delay quantity control unit 81. In the tables shown in FIG. 18, for example, "carrier pattern=0001" represents the case where only the channel CH1 is transmitted, "carrier pattern=0011" represents the case where the channels CH1 and CH2 are multiplexed, and "carrier pattern=1111" represents the case where the channels CH1 to CH4 are multiplexed.

FIG. 19 is a flowchart of a processing for determining a delay quantity referring to a carrier pattern. Basically, the processing is the same as the procedure explained referring to FIG. 10 except that steps S51 and S53 are performed before executing the steps S12 to S27, if the carrier pattern is referenced.

In the step S51, the present carrier pattern is checked. In other words, it determines which channel is used among the channels CH1 to CH4. The information whether or not respective channels are used is notified from a higher-level control apparatus (not shown) disposed within the transmitter to the delay quantity control unit 81.

In a step S52, it determines that the present carrier pattern is changed or not changed from the carrier pattern performed when the processing shown in the flowchart was performed previously. When the carrier pattern is changed, the limit values (including the upper and lower limit values) corresponding to the new carrier pattern is extracted from the table shown in FIG. 18 and is held.

The later processing is the same as the procedure explained referring to FIG. 10. In other words, the delay quantity to be set in the delay unit 31 is calculated in the steps S21 to S24, and the delay quantity is compared with the limit value obtained in the steps S51 to S53. When the calculated delay quantity does not exceed the above-defined limit value, the delay quantity is set in the delay unit 31 as it is. When the delay quantity exceeds the limit value, the limit value is set in the delay unit 31 instead of the calculated delay quantity.

Thus, this method allows the preferable limit value to be always used dynamically even if the carrier pattern is changed in the multiple carrier transmitter.

Figure 20:
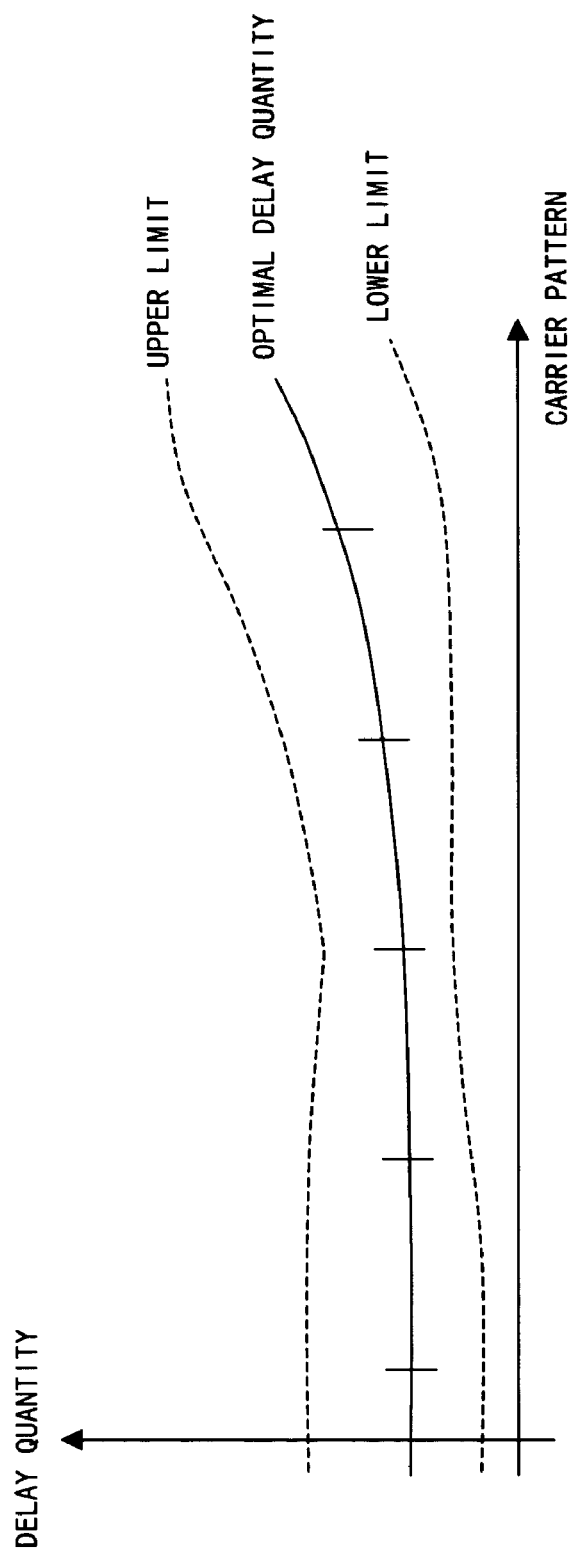
FIG. 20 is a schematic diagram showing an example for setting a width of adjusting range of a delay quantity depending on a carrier pattern.

The width of the limit value (adjustable range shown in FIG. 11) may be uniform to all carrier patterns as shown in FIG. 17, or may be changed in accordance with the carrier patterns as shown in FIG. 20. In the latter case, for example, when the band width used for transmitting the signal is increased, the width of the limit value may be decreased, or when the band width used for transmitting the signal is decreased, the width of the limit value may be increased. Specifically, in the central pattern of the five carrier patterns shown in example 2 of FIG. 16, the width of the limit value is set to be narrow. In the pattern at the right or left end, the width of the limit value is set to be wide.

Figure 21:
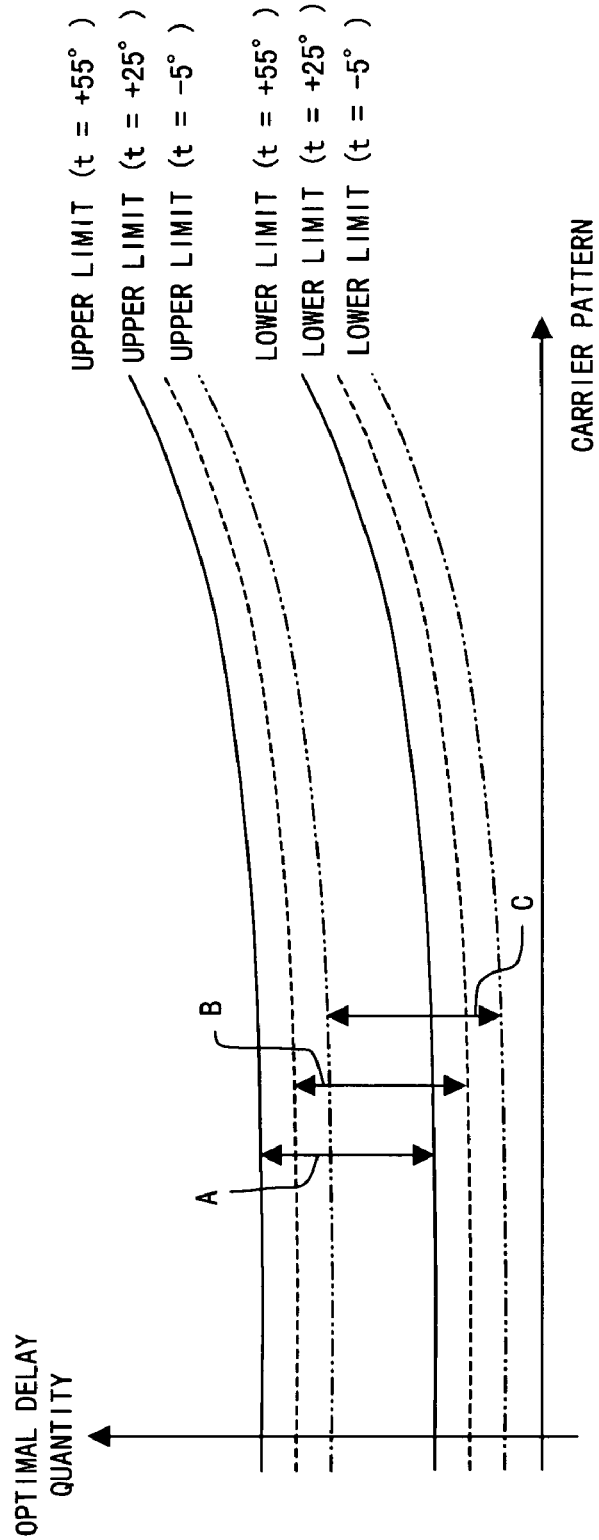
FIG. 21 is a schematic diagram showing an example for setting an adjusting range of a delay quantity depending on a temperature and a carrier pattern.

As shown in FIG. 21, the limit value of the delay quantity may be set taking both the temperature and the carrier pattern into consideration. In FIG. 21, a limit value range A when the temperature around the power amplifier 65 is at 55 degrees is drawn by a solid line, a limit value range B when the temperature is at 25 degree is drawn by a waved line, and a limit value range C when the temperature is at 5 degrees below zero is represented by a two-point chain line.

In the distortion compensation apparatus in this embodiment, the limit value is set for the delay quantity that should be notified to the delay unit 31, as described above. When the delay quantity calculated utilizing the correlation between the reference signal 21 and the feedback signal 22 exceeds the limit value, it is recognized that any damage may be produced, and the limit value is notified to the delay unit 31 instead of the delay quantity calculated. Accordingly, if any abnormality is produced in the reference signal 21 or the feedback signal 22, the distortion compensation apparatus does not run away, and the distortion produced in the transmitted signal can be suppressed to the predetermined value or less.

In the above-mentioned distortion compensation apparatus, the delay quantity calculated will be notified to the delay unit 31 as it is, as long as the delay quantity calculated does not exceed the limit value. However, even if the damage is not actually produced, the delay quantity can approach temporarily the limit value. In this case, it is desirable that the delay quantity be converged to the optimal delay quantity in a short time.

In the embodiment described below, the function to converge the delay quantity to the optimal delay quantity in a short time, when the delay quantity calculated utilizing the correlation between the reference signal 21 and the feedback signal 22 approach the limit value.

The distortion compensation apparatus described below performs the processing for adjusting the delay quantity at a predetermined cycle under the normal operation, as explained referring to FIG. 5. The "predetermined cycle" herein means about, for example, several minutes to several tens of minutes. The delay quantity is adjusted at every predetermined cycle by performing the flowchart shown in FIGS. 9 and 10. In this case, the unit time incremented in the step S22 and the unit time decremented in the step S23 are about, for example, several tens of pico seconds under the normal operation. The unit time corresponds to the magnitude of the change in the delay quantity at one processing for adjusting the delay quantity, and therefore is hereinafter called "adjustment step size."

Figure 22:
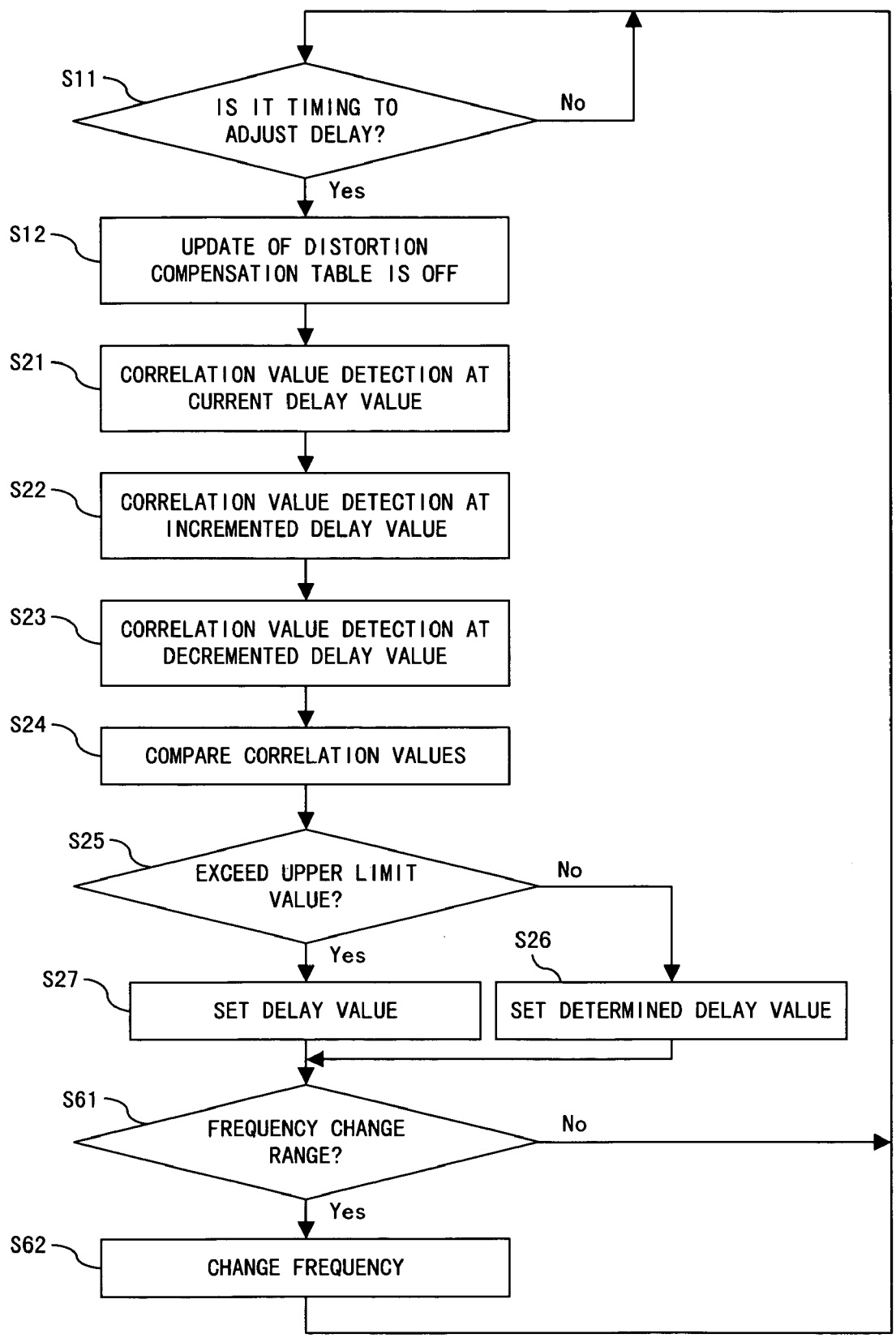
FIG. 22 is a flowchart of a processing for determining a delay quantity while changing a frequency of carrying out a delay quantity adjusting process.

FIG. 22 is a flowchart of a processing for determining a delay quantity while changing a frequency of carrying out a delay quantity adjusting processing.

The basic operation is the same as the procedure shown in FIG. 10. However, this flowchart includes the procedure of increasing the frequency to carry out the processing for adjusting the delay quantity, i.e., the procedure of shortening the cycle for performing the processing for adjusting the delay quantity, when the delay quantity to be notified to the delay unit 31 approaches the limit value. Specifically, the procedure is as follows:

After the delay quantity is notified to the delay unit 31 in the processes of the steps S11 to S27, steps S61 and S62 are carried out. In the step S61, it is determined that the delay quantity notified to the delay unit 31 is or is not within the frequency change range. The frequency change range is within the adjustment range defined by a set of limit values as shown in FIG. 23, and means the predetermined range adjacent to each limit value. Specifically, the frequency change range is constituted by the range from "a frequency threshold value at positive side" to "the upper limit value" and the range from "a frequency threshold value at negative side" to "the lower limit value." When the delay quantity calculated in the steps S21 to S24 exceeds the limit value, the limit value is notified to the delay unit 31. In this case, it may be estimated that the delay quantity which is notified to the delay unit 31 is within the frequency change range.

When the delay quantity which is notified to the delay unit 31 is within the frequency change range, in the step S62, the frequency of performing the processing for adjusting the delay quantity shown in the steps S21 to S27 is changed. Specifically, the time-out period of the timer is shortened, as explained referring to FIG. 5. In this case, the time-out period that is changed from about several minutes to several tens of minutes in the normal operation into several seconds to several tens of seconds. The period from the time to perform the processing for adjusting the delay quantity this time to the time to perform the processing for adjusting the delay quantity next time will be shortened as compared with that under the normal operation. Accordingly, if the delay quantity calculated is changed temporarily, the delay quantity to be notified to the delay unit 31 is expected to be converged to the optimal delay quantity in a short time.

Figure 24:
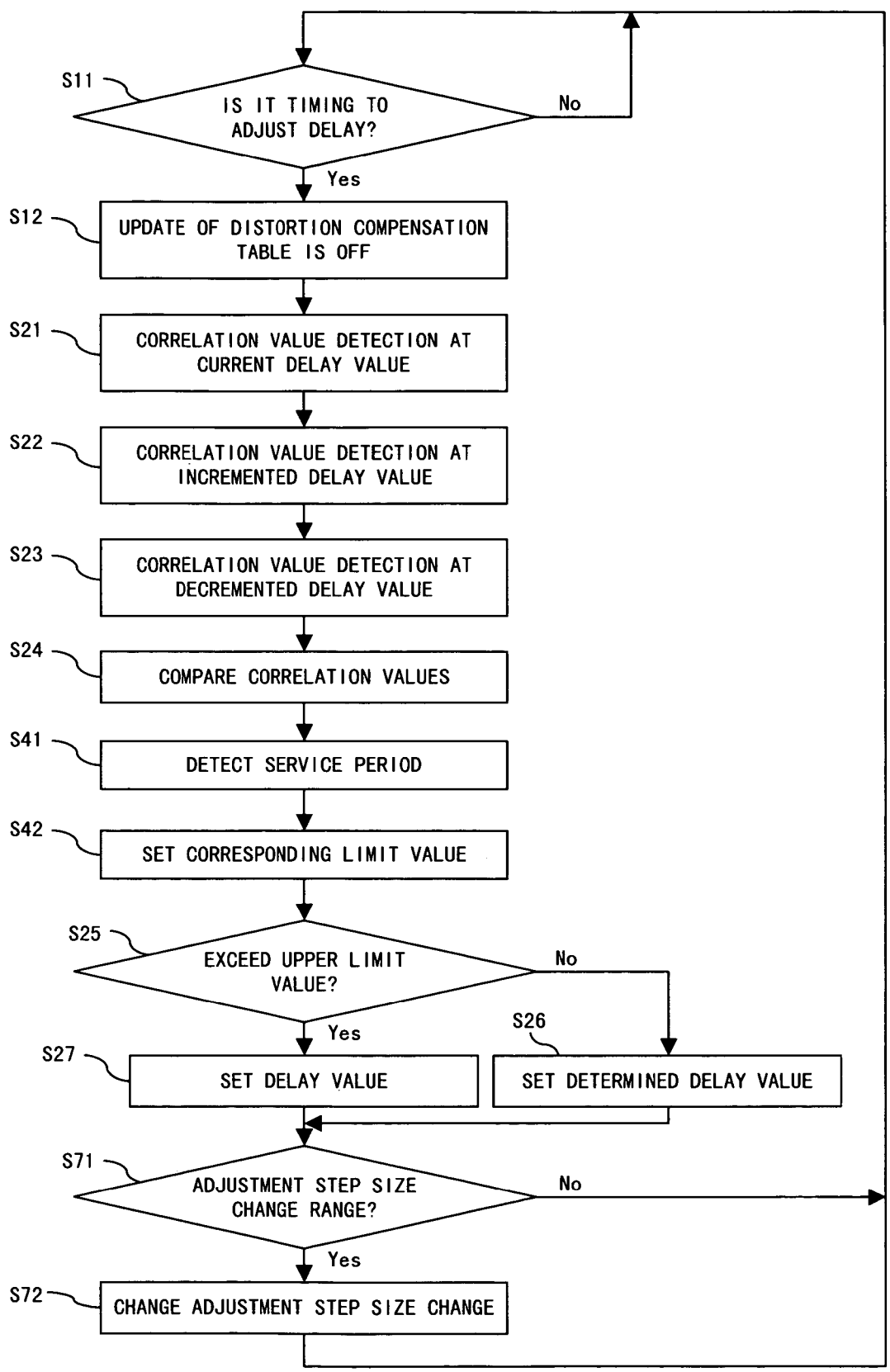
FIG. 24 is a flowchart of a processing for determining a delay quantity by changing a step size in a delay quantity adjusting process.

FIG. 24 is a flowchart of a processing for determining a delay quantity by changing a step size in a delay quantity adjusting process.

Figure 25:
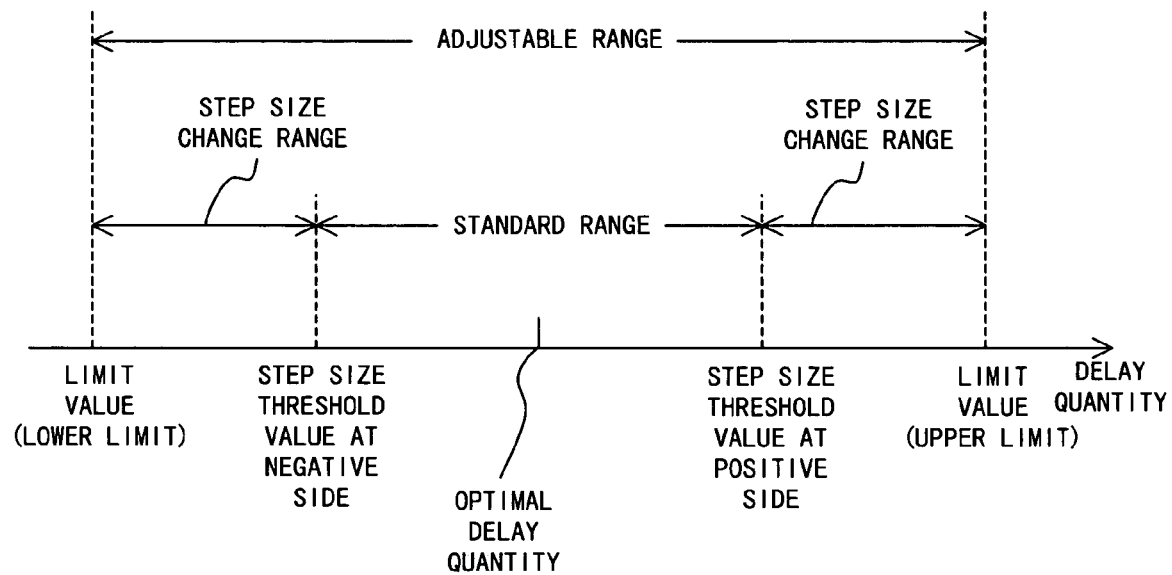
FIG. 25 is an illustration for explaining a step size changing range.

The basic operation of this flowchart is the same as the procedure shown in FIG. 22. However, in this flowchart, a step size in the processing for adjusting the delay quantity is changed instead of increasing the frequency to perform the processing for adjusting the delay quantity, when the delay quantity to be notified to the delay unit 31 approaches the limit value. Specifically, the procedure is as follows:

In a step S71, it is determined that the delay quantity notified to the delay unit 31 is or is not within a step size change range. As shown in FIG. 25, the step size change range is constituted by the range from "a step size threshold value at positive side" to "the upper limit value" and the range from "a step size threshold value at negative side" to "the lower limit value." The step size threshold value may be the same or different as/from the frequency threshold value as described above.

When the delay quantity notified to the delay unit 31 is within the step size change range, in a step S72, the adjustment step size is changed. Specifically, the adjustment step size used in the steps S22 and S23 is increased. In this case, the adjustment step size that is set to about several tens of pico seconds under the normal operation is changed to about several hundreds pico seconds. The adjustment step size in the processing for adjusting the delay quantity next time will be increased as compared with that under the normal operation. Accordingly, when the delay quantity calculated is changed temporarily, the delay quantity to be notified to the delay unit 31 is expected to be converged to the optimal delay quantity in a short time.

In the above-described embodiment, the timing between the reference signal and the feedback signal is matched by adjusting the delay quantity of the feedback signal. However, it is possible to provide similar advantages by adjusting the delay quantity of the reference signal. When the delay quantity of the reference signal is adjusted, it is also required to delay some signals including the signals supplied from the distortion compensation unit 12 to the distortion compensation signal updating unit 13.

In the above-described embodiment, a set of limit values (including the upper and lower limit values) are used to limit the setting range of the delay quantity. The present invention is not limited thereto, and may be applicable to the configuration that only one of the upper and lower limit values is used.

What is claimed is:

1. A distortion compensation apparatus used in a transmitter that produces and outputs a second signal from a first signal, comprising:
    a delay unit for delaying a feedback signal obtained from the second signal;
    a delay control unit for determining a delay quantity of said delay unit so that a timing difference being applied to a distortion compensation signal updating unit and between a reference signal obtained from the first signal and the feedback signal delayed by said delay unit is made small;
    a timer for measuring a period during which the transmitter is used; and
    a table for storing a corresponding relationship between a service period and a limit value of delay quantity, wherein
    said delay control unit limits the delay quantity within the limit value, and
    said delay control unit determines a range including the limit value by referring to the table using the measured period during which the transmitter is used.

2. A distortion compensation apparatus used in a transmitter that produces and outputs a second signal from a first signal, comprising:
    a delay unit for delaying a feedback signal obtained from the second signal;
    a delay control unit for determining a delay quantity of said delay unit so that a timing difference being applied to a distortion compensation signal updating unit and between a reference signal obtained from the first signal and the feedback signal delayed by said delay unit is made small; and
    a frequency adjusting unit for adjusting a frequency of carrying out a process that said delay control unit determines the delay quantity, wherein
    said delay control unit limits the delay quantity within a limit value,
    when the delay quantity exceeds a threshold and approaches the limit value, the frequency of carrying out the process that said delay control unit determines the delay quantity is made higher than that in the case where the delay quantity does not exceed the threshold,
    the frequency adjusting unit comprises a timer,
    the delay control unit determines the delay quantity when the timer is timed out,
    a time-out period is shortened while the delay quantity exceeds the threshold and approaches the limit value, and
    the time-out period is lengthened while the delay quantity returns within the threshold.

3. The distortion compensation apparatus according to claim 2, wherein a circuit that produces the second signal from the first signal comprises an amplifier.

4. The distortion compensation apparatus according to claim 2, further comprising an adjusting unit for gradually changing the delay quantity when the delay quantity is changed, wherein
    when the delay quantity exceeds the threshold and approaches the limit value, said adjusting unit increases a step size for changing the delay quantity as compared with that in the case where the delay quantity does not exceed the threshold.

5. The distortion compensation apparatus according to claim 2, wherein the limit value is determined under the condition that the transmitter uses a maximum band available for transmitting the signal and transmits the signal.

6. The distortion compensation apparatus according to claim 2, wherein the limit value is determined so that distortion properties of the signal transmitted from the transmitter satisfy a predetermined standard.

7. A distortion compensation apparatus used in a transmitter that produces and outputs a second signal from a first signal using a plurality of carrier waves, comprising:
    a delay unit for delaying a feedback signal obtained from the second signal;
    a delay control unit for determining a delay quantity of said delay unit so that a timing difference being applied to a distortion compensation signal updating unit and between a reference signal obtained from the first signal and the feedback signal delayed by said delay unit is made small,
    wherein said delay control unit limits the delay quantity within a limit value, and wherein the limit value is determined based on an allocation pattern of the plurality of carrier waves used for transmitting the second signal,
    said distortion compensation apparatus further comprises a table for storing limit values with respect to each carrier pattern,
    when changing carrier patterns, the limit value corresponding to a new carrier pattern is retrieved from the table, and
    the retrieved limit value is set and used in the delay control unit.

8. A distortion compensation apparatus used in a transmitter that produces and outputs a second signal from a first signal, comprising:
    a delay unit for delaying the first signal to produce a reference signal;
    a delay control unit for determining a delay quantity of said delay unit so that a timing difference being applied to a distortion compensation signal updating unit and between the reference signal and a feedback signal obtained from the second signal is made small; and a frequency adjusting unit for adjusting a frequency of carrying out a process that said delay control unit determines the delay quantity, wherein said delay control unit limits the delay quantity within a limit value, when the delay quantity exceeds a threshold and approaches the limit value, the frequency of carrying out the process that said delay control unit determines the delay quantity is made higher than that in the case where the delay quantity does not exceed the threshold, the frequency adjusting unit comprises a timer, the delay control unit determines the delay quantity when the timer is timed out, a time-out period is shortened while the delay quantity exceeds the threshold and approaches the limit value, and the time-out period is lengthened while the delay quantity returns within the threshold.

9. A distortion compensation apparatus used in a transmitter that produces and outputs a second signal from a first signal, comprising:

a delay unit for delaying a reference signal obtained from the first signal and a feedback signal obtained from the second signal;

a delay control unit for determining a delay quantity of said delay unit so that a timing difference being applied to a distortion compensation signal updating unit and between the reference signal and the feedback signal is made small; and a frequency adjusting unit for adjusting a frequency of carrying out a process that said delay control unit determines the delay quantity, wherein said delay control unit limits the delay quantity within a limit value, when the delay quantity exceeds a threshold and approaches the limit value, the frequency of carrying out the process that said delay control unit determines the delay quantity is made higher than that in the case where the delay quantity does not exceed the threshold, the frequency adjusting unit comprises a timer, the delay control unit determines the delay quantity when the timer is timed out, a time-out period is shortened while the delay quantity exceeds the threshold and approaches the limit value, and the time-out period is lengthened while the delay quantity returns within the threshold.

10. A transmitter for producing and outputting a second signal from a first signal, comprising:

a production unit for producing the second signal from the first signal;

a delay unit for delaying a feedback signal obtained from the second signal;

a delay control unit for determining a delay quantity of said delay unit so that a timing difference being applied to a distortion compensation signal updating unit and between a reference signal obtained from the first signal and the feedback signal delayed by said delay unit is made small; and a limiting unit for limiting the delay quantity within a limit value; and a frequency adjusting unit for adjusting a frequency of carrying out a process that said delay control unit determines the delay quantity, wherein when the delay quantity exceeds a threshold and approaches the limit value, the frequency of carrying out the process that said delay control unit determines the delay quantity is made higher than that in the case where the delay quantity does not exceed the threshold, the frequency adjusting unit comprises a timer, the delay control unit determines the delay quantity when the timer is timed out, a time-out period is shortened while the delay quantity exceeds the threshold and approaches the limit value, and the time-out period is lengthened while the delay quantity returns within the threshold.

* * * * *